(12) United States Patent
Chen et al.

(10) Patent No.: US 10,617,029 B2
(45) Date of Patent: Apr. 7, 2020

(54) BRACKET DEVICE

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Shang-Huang Chen, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 169 days.

(21) Appl. No.: 15/350,095

(22) Filed: Nov. 13, 2016

(65) Prior Publication Data
US 2017/0290424 A1   Oct. 12, 2017

(30) Foreign Application Priority Data

Apr. 12, 2016 (TW) .............................. 105111449 A
Sep. 13, 2016 (TW) .............................. 105129908 A

(51) Int. Cl.
*H05K 7/14* (2006.01)
*A47B 88/43* (2017.01)
(52) U.S. Cl.
CPC ........... *H05K 7/1489* (2013.01); *A47B 88/43* (2017.01)
(58) Field of Classification Search
CPC .................. A47B 88/044; A47B 88/43; A47B 2210/0081; A47B 2210/016; A47B 88/0418; A47B 88/10; A47B 88/16; A47B 88/04; A47B 88/0407; A47B 2210/0059; A47B 2210/0032; H05K 7/1489; H05K 7/14
USPC ......................................... 248/220.21, 220.31
See application file for complete search history.

(56) References Cited

U.S. PATENT DOCUMENTS

| | | | | |
|---|---|---|---|---|
| 7,357,362 B2* | 4/2008 | Yang | .................... | H05K 7/1489 248/220.22 |
| 7,552,899 B2* | 6/2009 | Chen | ...................... | A47B 88/43 211/26 |
| 7,988,246 B2* | 8/2011 | Yu | .......................... | A47B 88/43 211/175 |
| 8,231,188 B1* | 7/2012 | Chen | ...................... | A47B 88/57 312/333 |
| 8,353,494 B2* | 1/2013 | Peng | ...................... | A47B 88/43 211/192 |
| 8,408,506 B2* | 4/2013 | Yu | .......................... | A47B 88/43 248/219.1 |
| 8,727,138 B2 | 5/2014 | Dittus | | |
| 8,770,528 B2 | 7/2014 | Chen | | |

(Continued)

FOREIGN PATENT DOCUMENTS

DE   20 2004 018 376 U1   1/2005
JP           3127644 U   12/2006

*Primary Examiner* — Kimberly T Wood
(74) *Attorney, Agent, or Firm* — Winston Hsu

(57) ABSTRACT

A bracket device includes a bracket, a mounting member and a locking member. The bracket has a side plate and an end plate connected to the slide plate. The mounting member is arranged on the end plate of the bracket. One of the bracket and the locking member provides a moving area for allowing the locking member to move between a first position and a second position relative to the bracket.

18 Claims, 22 Drawing Sheets

(56) References Cited

U.S. PATENT DOCUMENTS

| | | | |
|---|---|---|---|
| 8,807,351 B2* | 8/2014 | Lin | A47B 88/43 |
| | | | 211/26 |
| 9,125,489 B2* | 9/2015 | Chen | A47B 88/044 |
| 9,370,120 B2 | 6/2016 | Chen | |
| 9,382,943 B2 | 7/2016 | Judge | |
| 9,480,183 B2* | 10/2016 | Chen | H05K 7/1489 |
| 2003/0062812 A1* | 4/2003 | Hwang | A47B 88/493 |
| | | | 312/334.34 |
| 2008/0067907 A1* | 3/2008 | Chen | A47B 88/43 |
| | | | 312/312 |
| 2008/0203251 A1* | 8/2008 | Chen | G06F 1/183 |
| | | | 248/200 |
| 2009/0114785 A1* | 5/2009 | Huang | H05K 7/1489 |
| | | | 248/220.31 |
| 2009/0294393 A1* | 12/2009 | Chen | H05K 7/1489 |
| | | | 211/175 |
| 2010/0072153 A1* | 3/2010 | Chen | H05K 7/1421 |
| | | | 211/183 |
| 2011/0290746 A1* | 12/2011 | Lu | H05K 7/1489 |
| | | | 211/26 |
| 2012/0193489 A1* | 8/2012 | Yu | H05K 7/1489 |
| | | | 248/201 |
| 2013/0056432 A1 | 3/2013 | Lin | |
| 2014/0070064 A1* | 3/2014 | Chen | A47B 88/43 |
| | | | 248/221.11 |
| 2014/0363108 A1* | 12/2014 | Chen | A47B 88/044 |
| | | | 384/22 |
| 2015/0069196 A1* | 3/2015 | Chen | A47B 47/0058 |
| | | | 248/218.4 |
| 2015/0201754 A1* | 7/2015 | Chen | A47B 96/025 |
| | | | 248/219.3 |
| 2016/0324317 A1* | 11/2016 | Chen | A47B 88/43 |

* cited by examiner

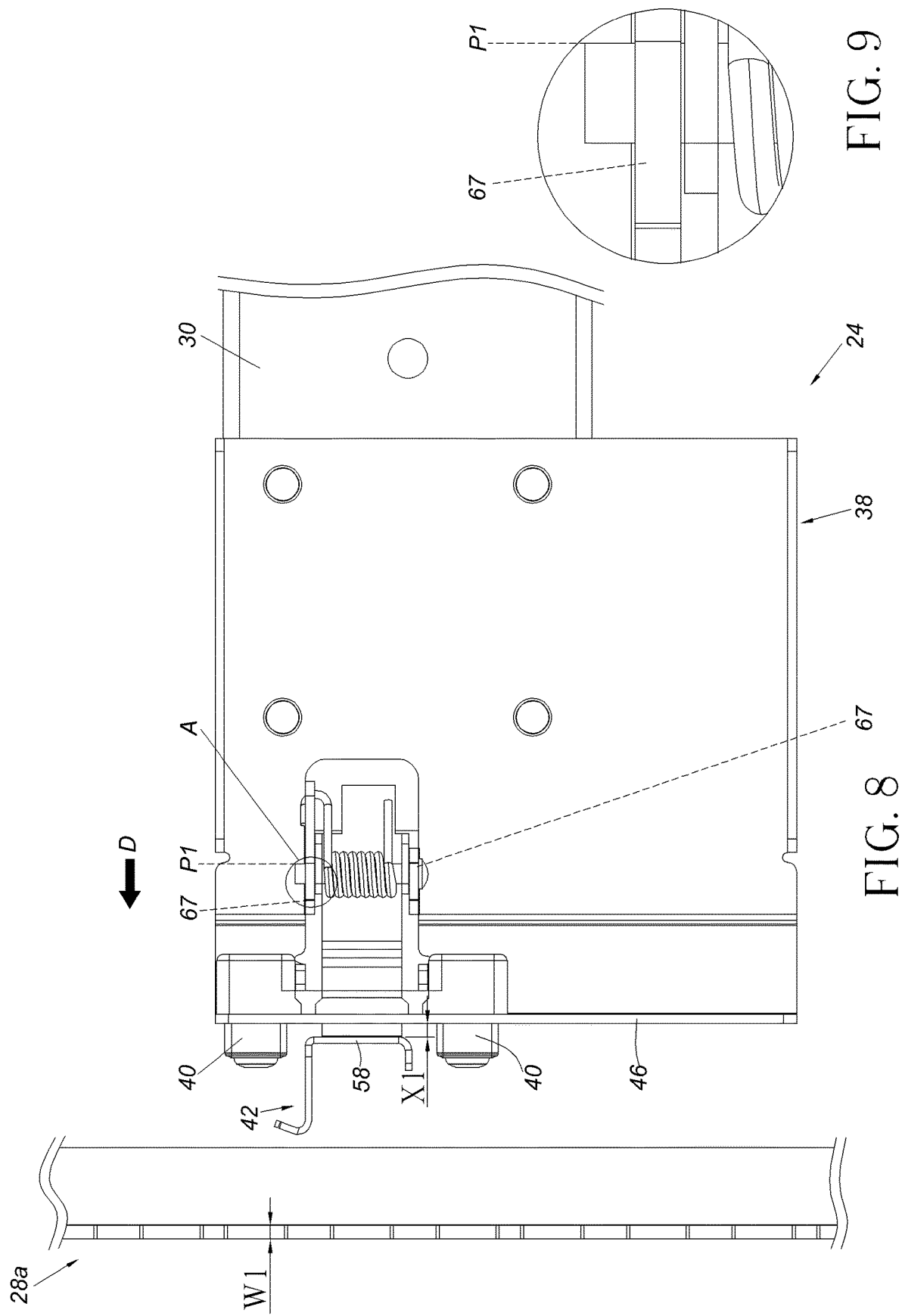

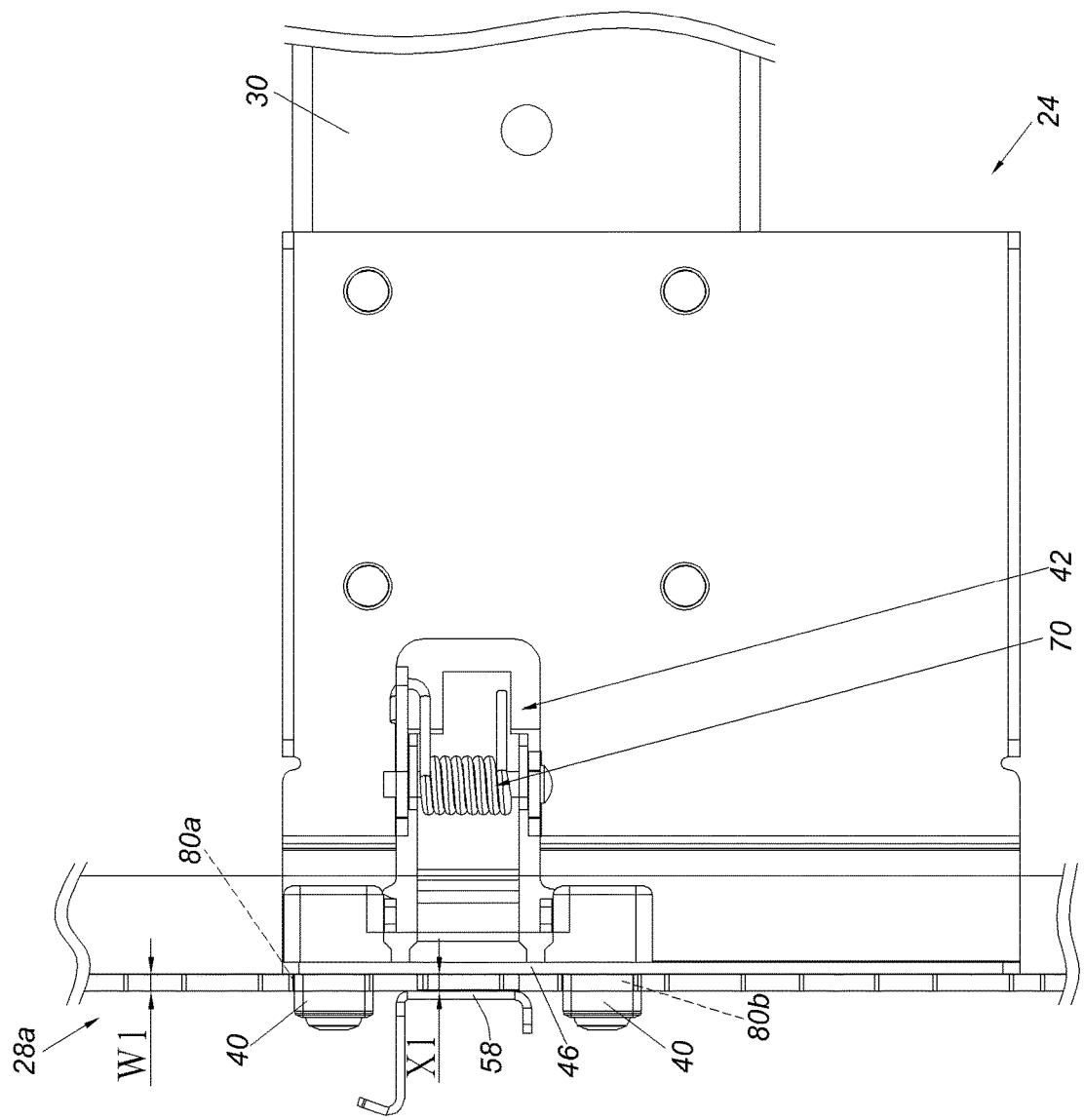

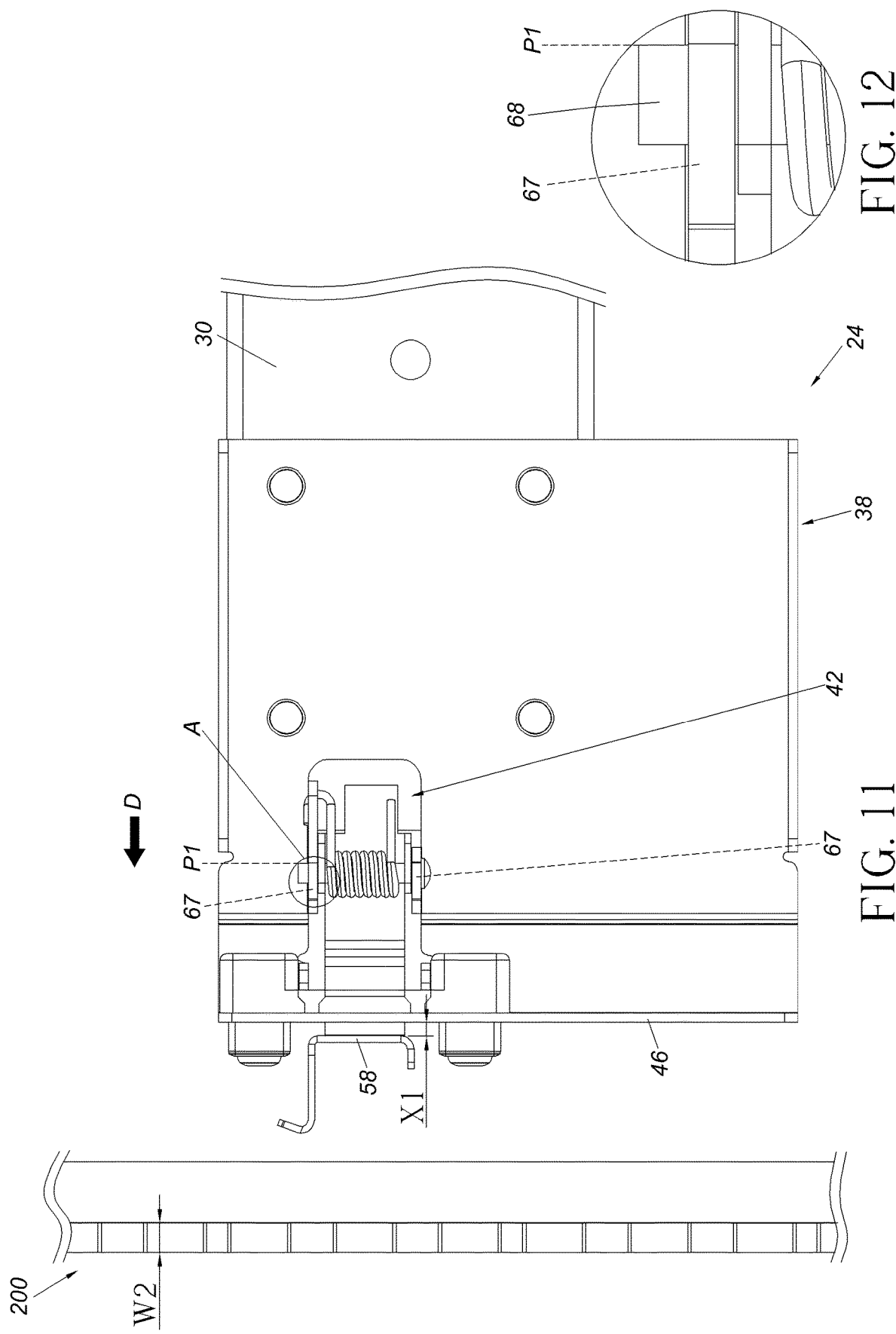

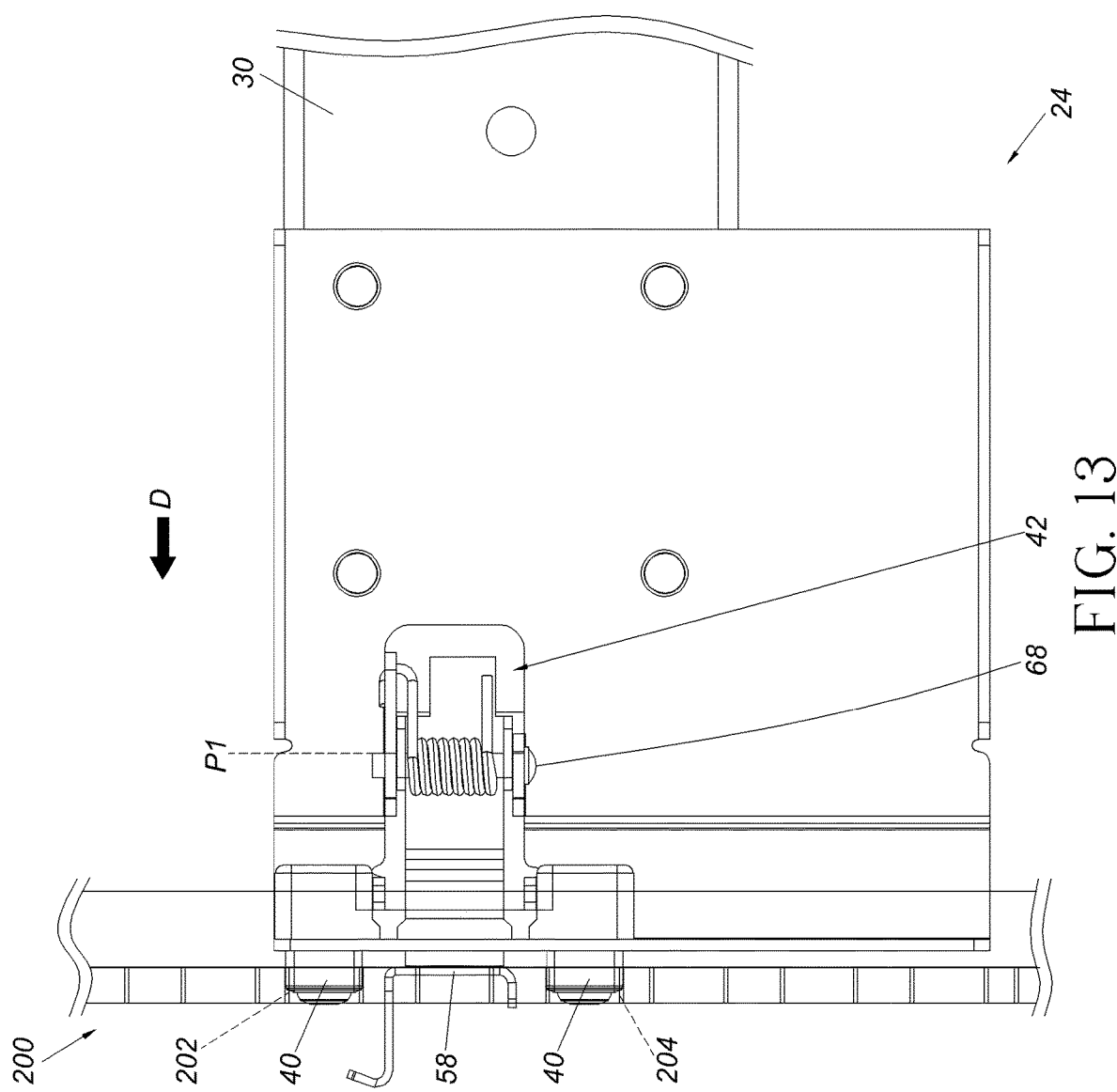

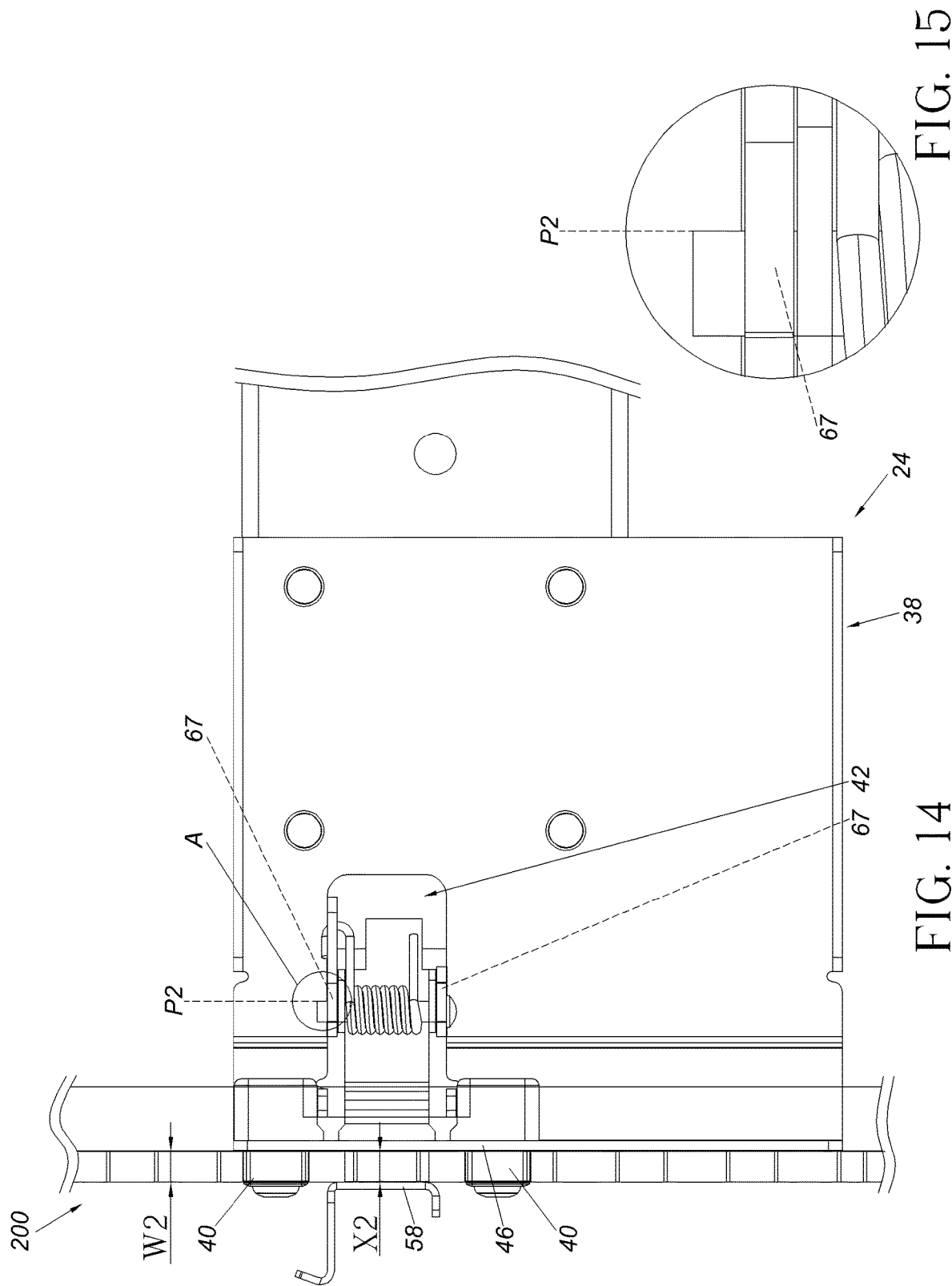

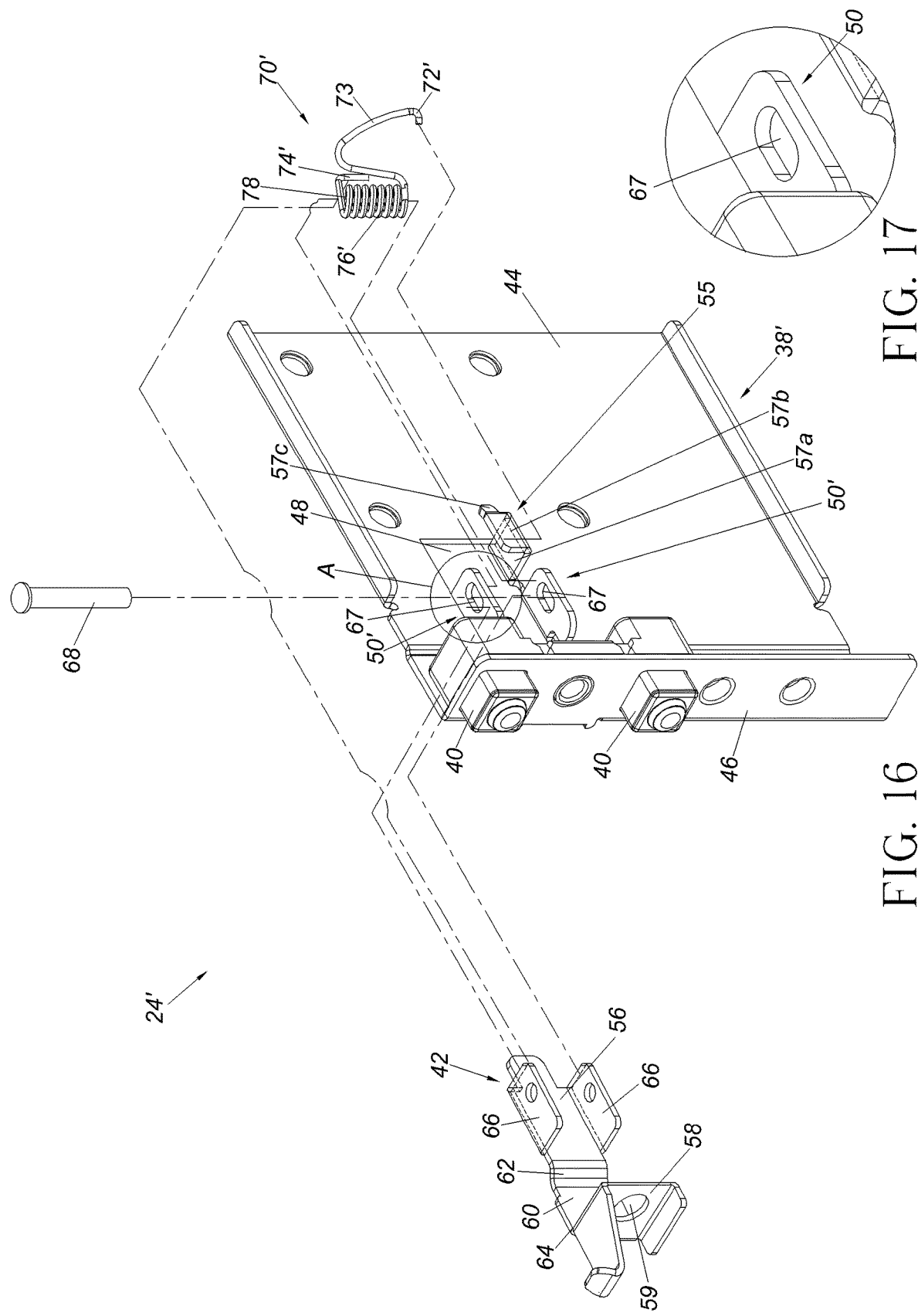

BRACKET DEVICE

BACKGROUND OF THE INVENTION

1. Field of the Invention

The present invention relates to a bracket device, and more particularly, to a bracket device capable of mounting a rail to a post of a rack.

2. Description of the Prior Art

In a rack system, a slide rail assembly is usually mounted to a post of a rack through a bracket. U.S. Pat. No. 8,770,528 B2 discloses a bracket assembly for a rack. The rack has a plurality of holes. The bracket assembly comprises a bracket and a fastening member pivoted to the bracket. Wherein, a plurality of connection members are inserted into the holes of the rack, and the fastening member provides an elastic force and has a fastening portion to be hooked to the rack, so as to connect the bracket to the rack.

However, specifications or dimensions of the racks may be different. Therefore, it is necessary to develop a bracket product applicable to different types of racks in order to improve efficiency of the bracket product.

SUMMARY OF THE INVENTION

The present invention relates to a bracket device with locking member movable relative to a bracket.

According to an embodiment of the present invention, a bracket device comprises a bracket, a mounting member and a locking member. The bracket has a side plate and an end plate connected to the side plate. The mounting member is arranged on the endplate of the bracket. Wherein, one of the bracket and the locking member provides a moving area for allowing the locking member to move between a first position and a second position relative to the bracket.

Preferably, the bracket device further comprises a pivoting member penetrating through a portion of the moving area. The locking member is rotatable relative to the bracket through the pivoting member.

Preferably, the bracket device further comprises an elastic member configured to provide an elastic force to the locking member. The locking member is located at a predetermined position in response to the elastic force of the elastic member.

Preferably, the end plate is substantially perpendicularly connected to the side plate. The locking member comprises a locking part. A first distance is defined between the locking part of the locking member and the endplate of the bracket when the locking member is located at the first position relative to the bracket. A second distance is defined between the locking part of the locking member and the end plate of the bracket when the locking member is located at the second position relative to the bracket.

Preferably, the bracket has at least one ear part connected to the side plate. The at least one ear part provides the moving area. The locking member further comprises a base part. A protrusion section is formed on the base part and bent relative to the base part. The pivoting member penetrates through the protrusion section of the locking member and the moving area of the at least one ear part.

Preferably, the side plate of the bracket has an opening arranged at a position corresponding to the base part of the locking member.

Preferably, the elastic member comprises a first part, a second part and a winding part arranged between the first part and the second part. The winding part is configured to allow a portion of the pivoting member to pass through. The first part is configured to contact the bracket. The second part is configured to contact the locking member.

Preferably, the locking part of the locking member has a mounting hole. The bracket device further comprises a fixing member fixed to the end plate of the bracket through the mounting hole.

Preferably, the moving area is an elongated hole or an elongated groove.

Preferably, the elastic member comprises a first part, a second part and a winding part arranged between the first part and the second part. The winding part provides a space for allowing a portion of the pivoting member to pass through. The bracket has an extension section. The first part of the elastic member is configured to abut against the extension section of the bracket. The second part of the elastic member is configured to abut against the locking member.

Preferably, the first part of the elastic member has a substantially U-shaped elastic arm for generating a pulling force to pull the locking member toward the first position relative to the end plate of the bracket.

According to another embodiment of the present invention, a bracket device comprises a bracket, a mounting member and a locking member. The bracket has a side plate and an end plate. The mounting member is arranged on the endplate of the bracket. The locking member comprises a locking part. Wherein, one of the bracket and the locking member provides a moving area for allowing the locking member to move between a first position and a second position relative to the bracket. Wherein, a first distance is defined between the locking part of the locking member and the endplate of the bracket when the locking member is located at the first position relative to the bracket. Wherein, a second distance is defined between the locking part of the locking member and the end plate of the bracket when the locking member is located at the second position relative to the bracket.

According to another embodiment of the present invention, a bracket device is configured to be mounted to a post. The post has a hole. The bracket device comprises a bracket, a mounting member, a locking member, a pivoting member and an elastic member. The bracket has a side plate and an end plate substantially perpendicularly connected to the side plate. The mounting member is arranged on the endplate of the bracket and configured to penetrate through the hole of the post. The locking member is mounted to the bracket. One of the locking member and the bracket provides a moving area for allowing the locking member to move between a first position and a second position relative to the bracket. The locking member comprises a locking part. A first distance is defined between the locking part and the end plate of the bracket when the locking member is located at the first position. A second distance is defined between the locking part and the endplate of the bracket when the locking member is located at the second position. The pivoting member penetrates through a portion of the moving area. The locking member is rotatable relative to the bracket through the pivoting member. The elastic member is configured to provide an elastic force to the locking member.

Preferably, the locking part of the locking member has a mounting hole. The bracket device further comprises a fixing member configured to fix the end plate of the bracket to the post through the mounting hole.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 8 is a diagram showing the bracket device of the first embodiment of the present invention being moved toward the post in order to mount a rail to a post with a first thickness.

FIG. 9 is an enlarged view of an area A in FIG. 8 for showing the locking member being located at a first position relative to the bracket.

FIG. 10 is a diagram showing the bracket device in FIG. 8 being mounted to the post, and a first distance being defined between a locking part of the locking member and an end plate of the bracket, and the first distance corresponding to the first thickness of the post.

FIG. 11 is a diagram showing the bracket device being moved toward a post for mounting the rail to another post with a second thickness according to the first embodiment of the present invention.

FIG. 12 is an enlarged view of an area A in FIG. 11 for showing the locking member being located at the first position relative to the bracket.

FIG. 13 is a diagram showing the mounting members on the bracket of the bracket device in FIG. 11 being aligned to holes of the post.

FIG. 14 is a diagram showing the bracket device in FIG. 11 being mounted to the post, and a second distance being defined between the locking part of the locking member and the end plate of the bracket, and the second distance corresponding to the second thickness of the post.

FIG. 15 is an enlarged view of an area A in FIG. 14 for showing the locking member being located at the second position relative to the bracket.

FIG. 16 is an exploded view of the bracket device according to a second embodiment of the present invention.

FIG. 17 is an enlarged view of an area A in FIG. 16 for showing a moving area configured to allow a locking member to be moved relative to a bracket.

DETAILED DESCRIPTION

Figure 1:
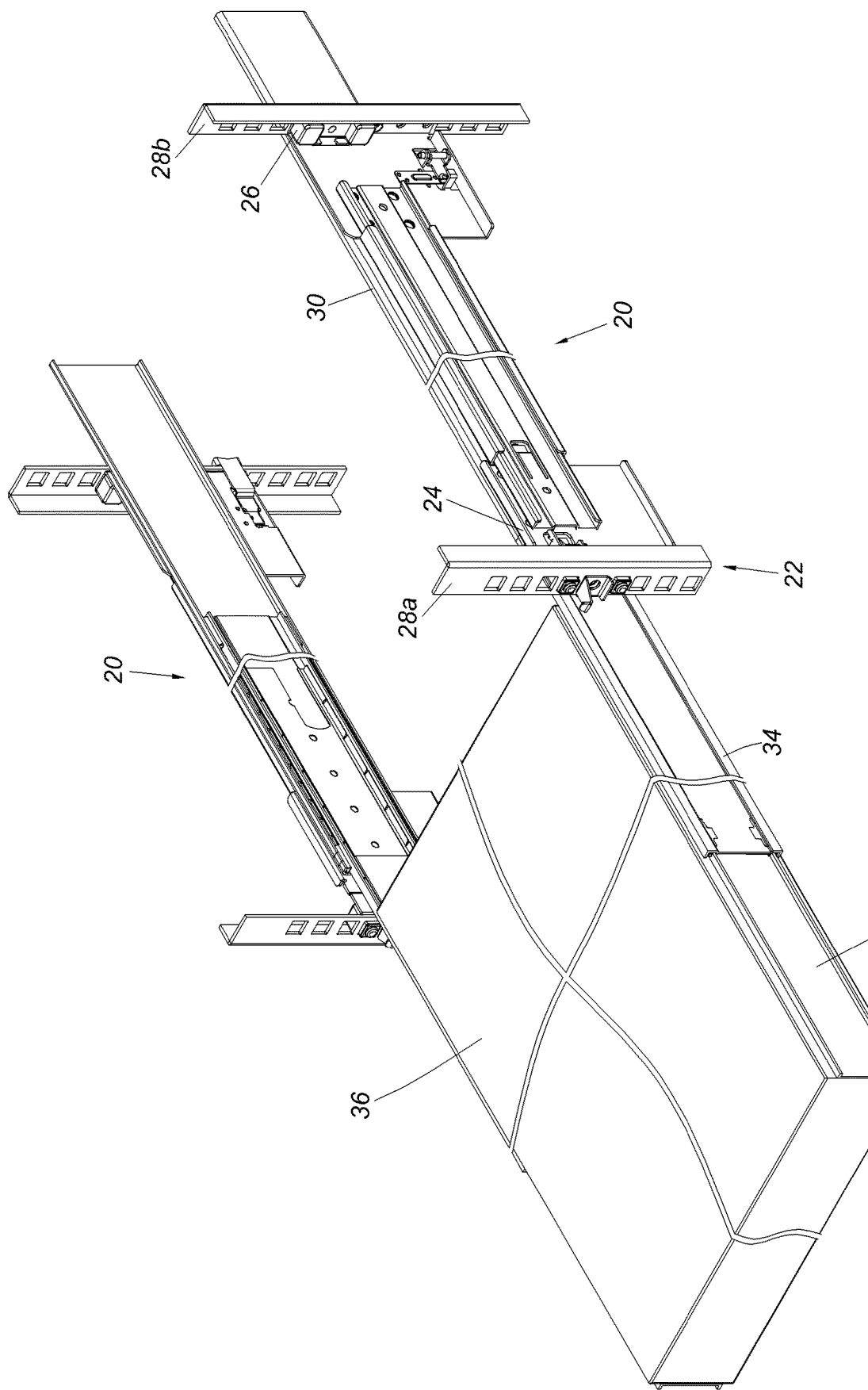
FIG. 1 is a diagram showing a bracket device capable of mounting a slide rail assembly to a rack, and the slide rail assembly being mounted with a carrying object according to an embodiment of the present invention.

FIG. 1 is a diagram showing a pair of slide rail assemblies 20 being mounted to a rack 22 according to an embodiment of the present invention. Two portions, such as a front portion and a rear portion, of each of the slide rail assemblies 20 are respectively mounted to a first post 28a and a second post 28b of the rack 22 through a first bracket device 24 and a second bracket device 26. In particular, each of the slide rail assemblies 20 comprises a first rail 30 and a second rail 32 longitudinally movable relative to the first rail 30. Preferably, each of the slide rail assemblies 20 further comprises a third rail 34 configured to increase a travelling distance of the second rail 32 relative to the first rail 30. Wherein, the second rail 32 is configured to be mounted with a carrying object 36, such as a chassis or a drawer of an electronic apparatus.

Figures 2, 3:
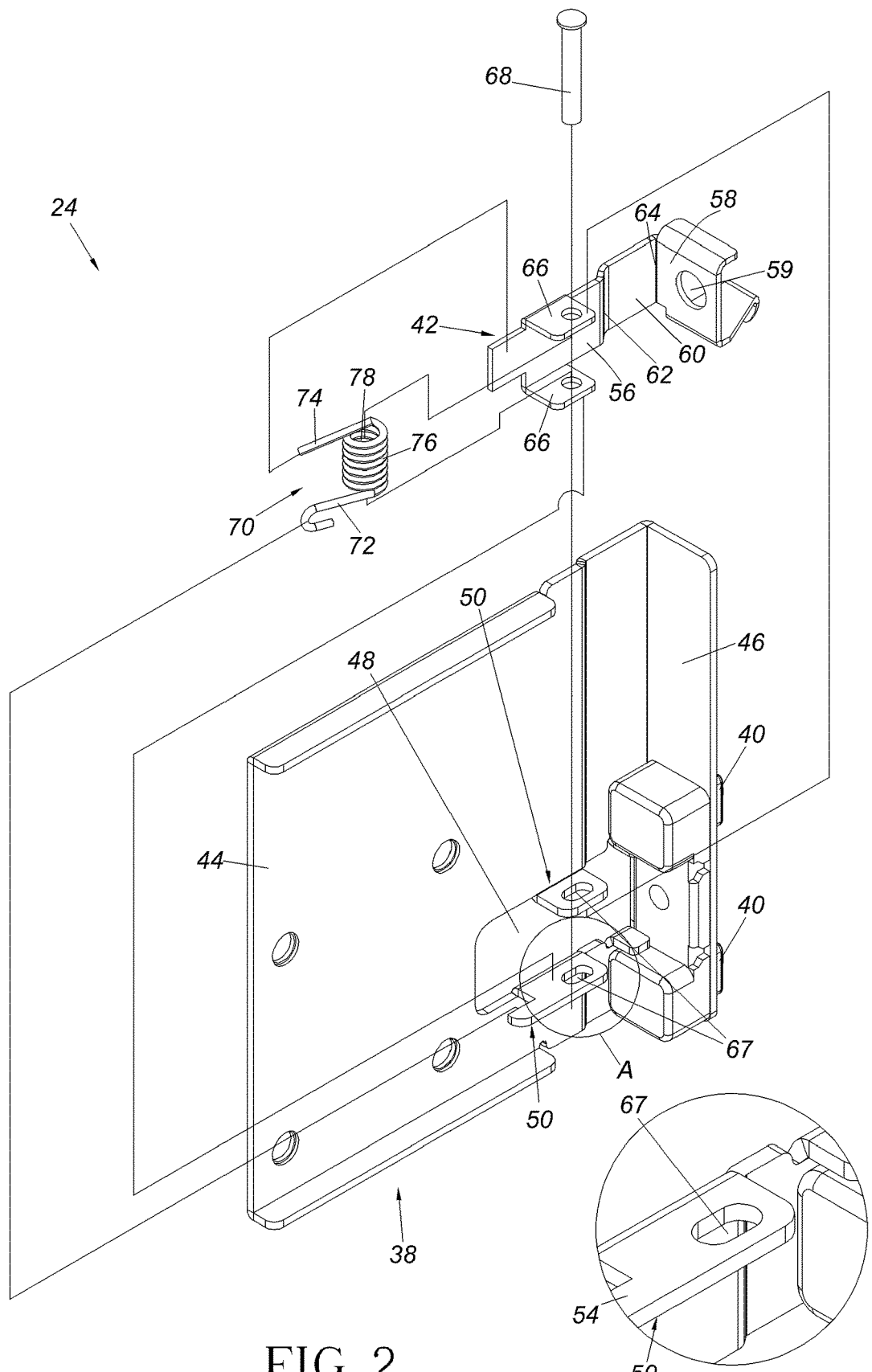
FIG. 2 is an exploded view of the bracket device according to a first embodiment of the present invention.
FIG. 3 is an enlarged view of an area A in FIG. 2 for showing a moving area configured to allow a locking member to be moved relative to a bracket.
Figure 4:
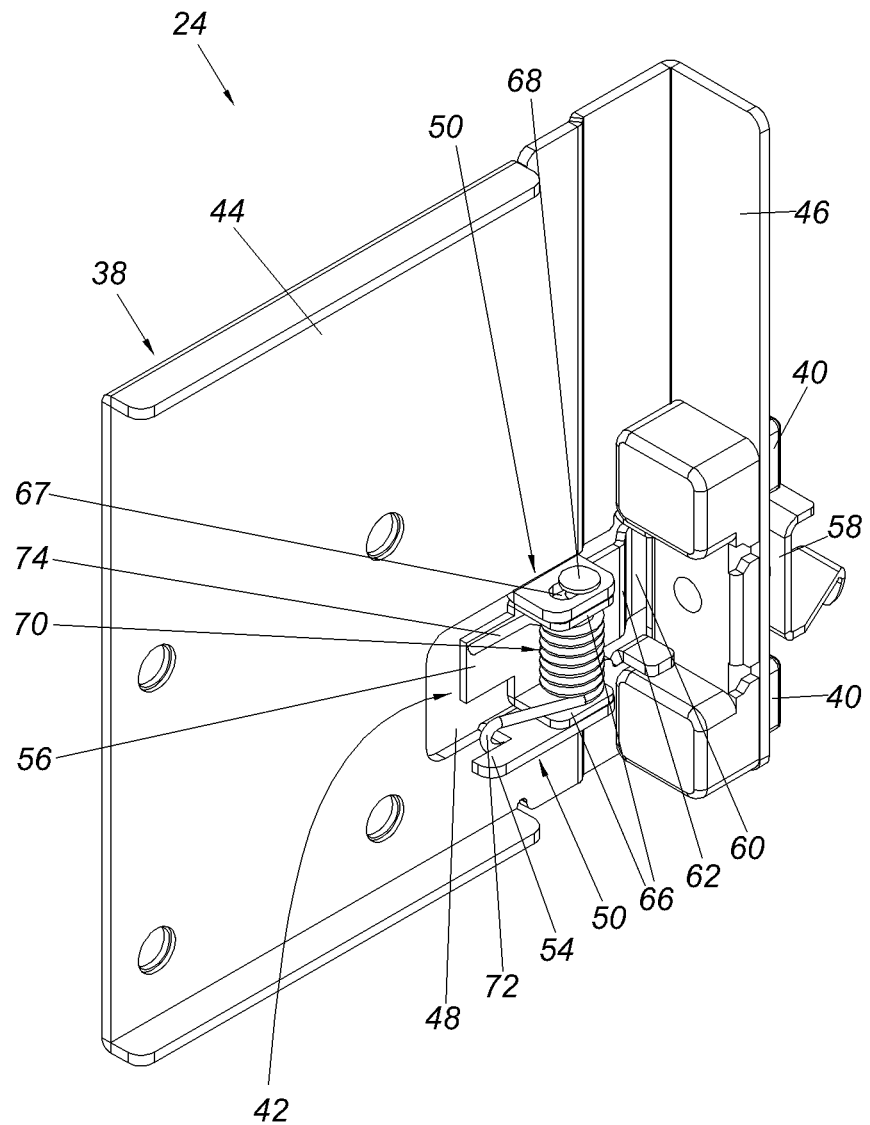
FIG. 4 is a diagram showing the bracket device according to the first embodiment of the present invention.

As shown in FIG. 2, FIG. 3 and FIG. 4, the first bracket device 24 (hereinafter referred to as bracket device 24) comprises a bracket 38, at least one mounting member 40 and a locking member 42.

The bracket 38 has a side plate 44 and an end plate 46 connected to the slide plate 44. Wherein, the end plate 46 is substantially perpendicularly connected to the side plate 44. Preferably, the side plate 44 of the bracket 38 has an opening 48, and the bracket 38 has at least one ear part 50 connected to the side plate 44. In the present embodiment, the bracket 38 has a pair of ear parts 50 connected to the slide plate 44 and adjacent to the opening 48 for example. Wherein, one of the pair of the ear parts 50 is formed with an extension section 54.

The at least one mounting member 40, such as a pair of mounting members 40, can be arranged on the end plate 46 of the bracket 38. Such arrangement is well known to those skilled in the art, therefore, no further illustration is provided.

The locking member 42 is mounted to the bracket 38. The locking member 42 comprises a base part 56 and a locking part 58. Wherein, the base part 56 is located at a position corresponding to the opening 48 of the bracket 38 for allowing a user to operate. The locking part 58 has a mounting hole 59. Preferably, the locking member 42 further comprises a middle part 60 located between the base part 56 and the locking part 58. The middle part 60 has a first end 62 and a second end 64 opposite to the first end 62. The first end 62 is inclined relative to the base part 56. The second end 64 is substantially perpendicularly connected to the locking part 58. Moreover, the base part 56 of the locking member 42 is formed with at least one protrusion section 66 bent relative to the base part 56. In the present embodiment, a pair of protrusion sections 66 is bent relative to the base part 56 for example. The pair of protrusion sections 66 is adjacent to the pair of ear parts 50.

One of the locking member 42 and the bracket 38 provides a moving area 67. In the present embodiment, the moving area 67 is arranged in a longitudinal direction for allowing the locking member 42 longitudinally movable relative to the bracket 38. In the present embodiment, the bracket 38 provides the moving area 67. For example, the pair of ear parts 50 of the bracket 38 provides the moving area 67. Wherein, the moving area 67 can be an elongated hole or an elongated groove. Although the bracket 38 provides the moving area 67 in the present embodiment, the locking member 42 may provide the moving area 67 alternately. Briefly, the moving area 67 allows the locking member 42 to be longitudinally moved relative to the bracket 38.

Preferably, the bracket device 24 further comprises a pivoting member 68 and an elastic member 70. The pivoting member 68 penetrates through a portion of the moving area 67. In particular, the pivoting member 68 penetrates through a portion of the moving area 67 of the bracket 38 and the pair of protrusion sections 66 of the locking member 42. The elastic member 70 is configured to provide an elastic force to the locking member 42. The locking member 42 is located at a predetermined position in response to the elastic force of the elastic member 70. Furthermore, the elastic member 70 comprises a first part 72, a second part 74 and a winding part 76 arranged between the first part 72 and the second part 74. The winding part 76 provides a space 78 for allowing a portion of the pivoting member 68 to pass through. The first part 72 is configured to contact the bracket 38. The second part 74 is configured to contact the locking member 42. In the present embodiment, the first part 72 abuts against the extension section 54 of the bracket 38, and the second part 74 abuts against the base part 56 of the locking member 42.

Figure 5:
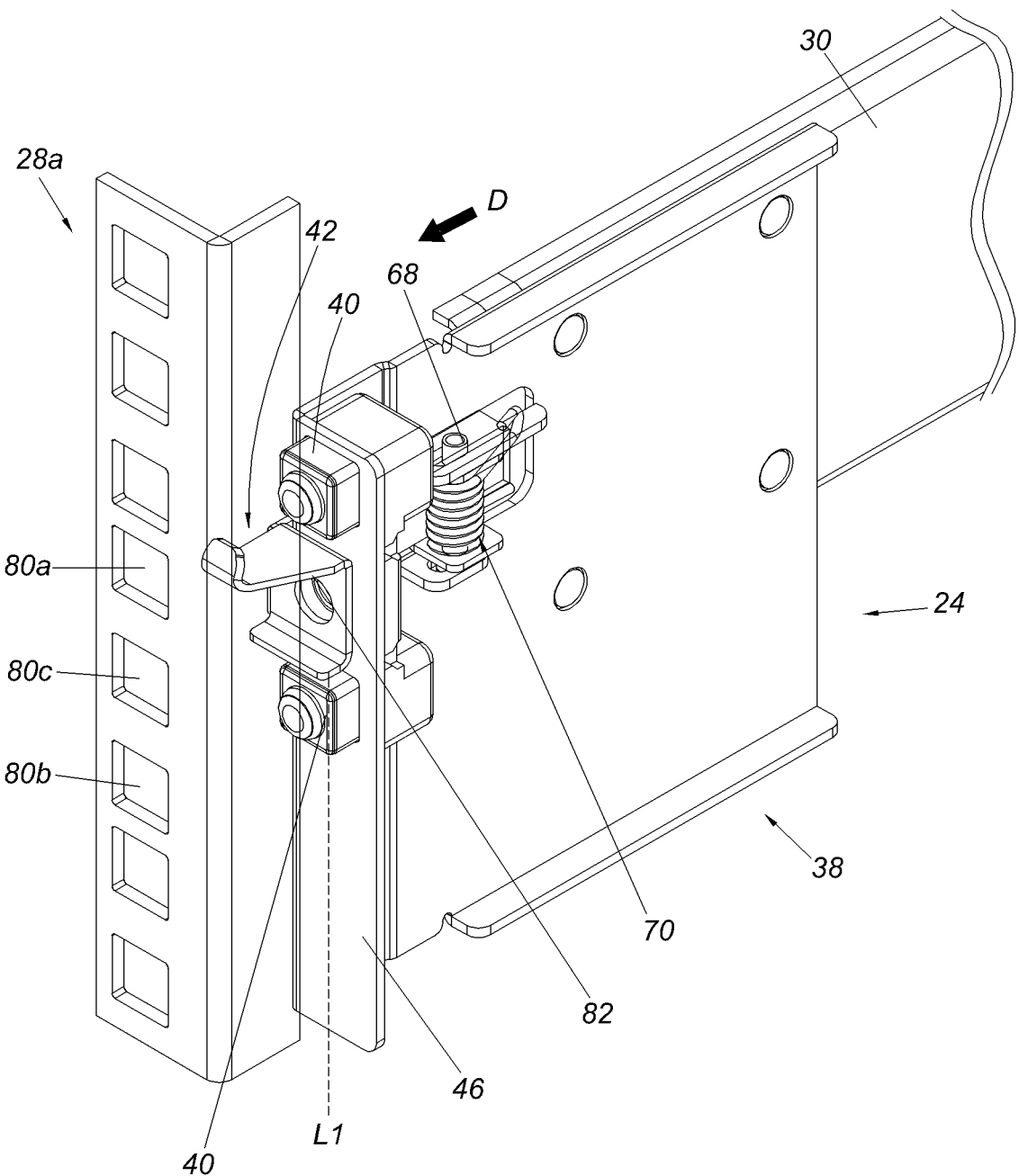
FIG. 5 is a diagram showing a rail being moved toward a post along a direction with the bracket device according to an embodiment of the present invention.

As shown in FIG. 5, the first post 28a has a plurality of holes, such as a first hole 80a, a second hole 80b and a third hole 80c. On the other hand, the bracket device 24 is in a locking state. For example, the locking member 42 of the bracket device 24 is located at a locking position L1 (a close position) relative to the end plate 46 of the bracket 38 in response to the elastic force of the elastic member 70.

Figure 6:
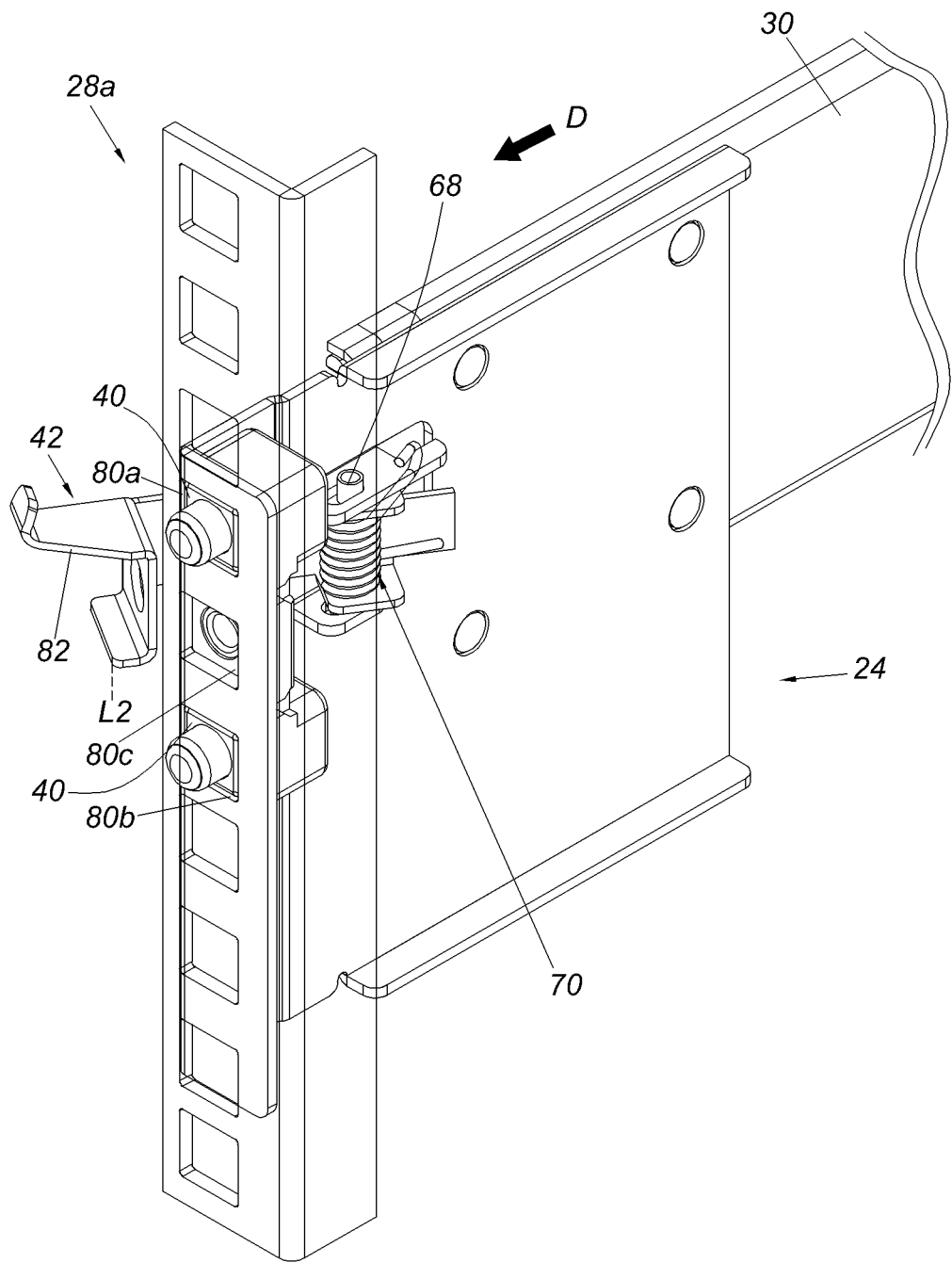
FIG. 6 is a diagram showing the locking member of the bracket device in FIG. 5 being in an unlocking state relative to the bracket, and mounting members on the bracket being aligned to holes of the post.

As shown in FIG. 6, the first rail 30 of the aforementioned slide rail assembly 20 can be moved toward the first post 28a along a direction D, in order to be mounted to the first post 28a through the bracket device 24. During such mounting process, one part of the locking member 42 of the bracket device 24, such as a guiding part 82 (a guiding structure with an inclined surface or a curved surface), can abut against a lateral side of the first post 28a, such that the locking member 42 is rotated relative to the bracket 38 through the pivoting member 68 from the locking position L1 to be in a unlocking state, such as being located at a unlocking position L2 (an open position). Such operation is well known to those skilled in the art, therefore, no further illustration is provided. The elastic member 70 then accumulates an elastic force in response to the locking member 42 being located at the unlocking position L2. On the other hand, the pair of mounting members 40 of the bracket device 24 can penetrate through the first hole 80a and the second hole 80b of the first post 28a.

Figure 7:
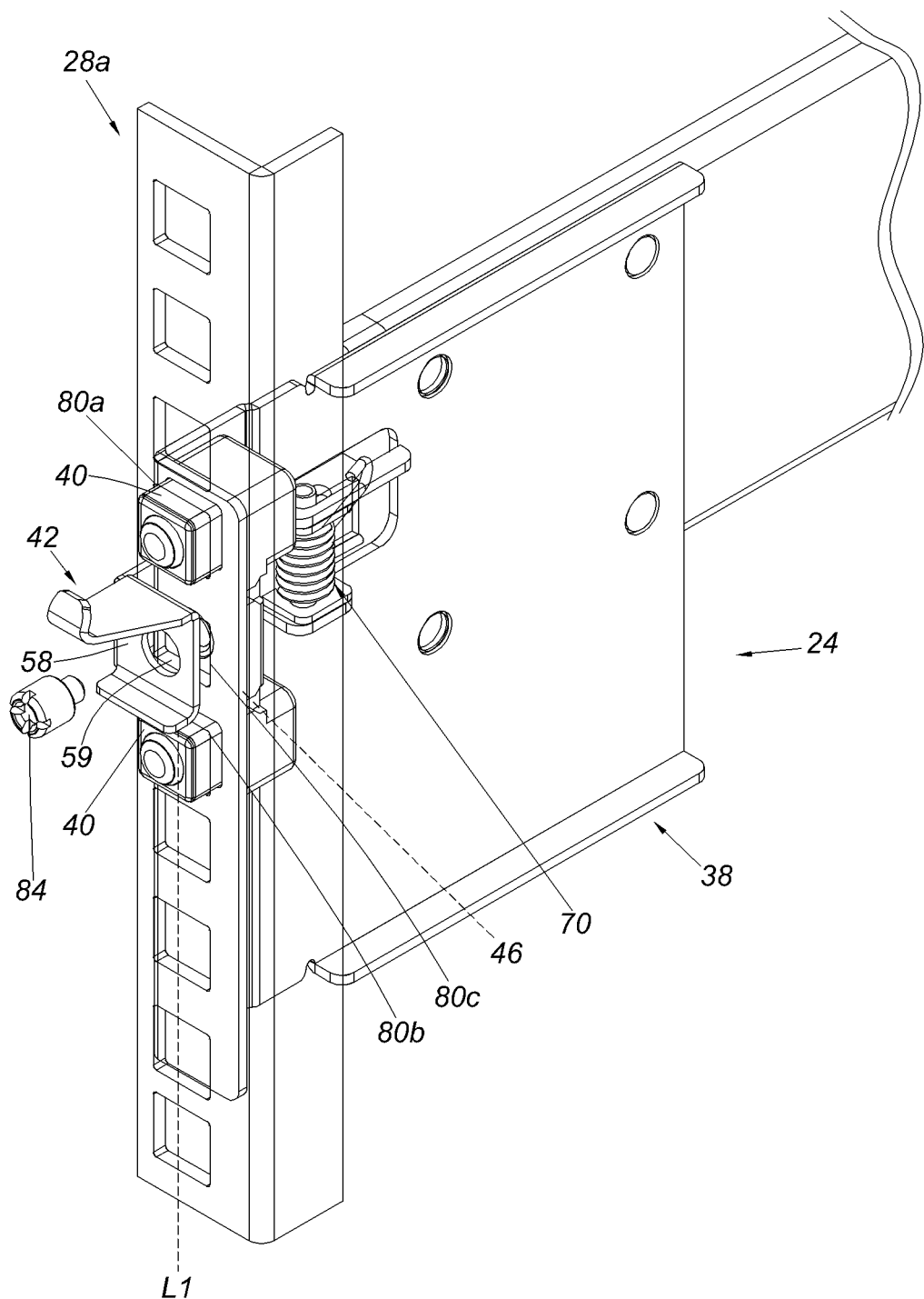
FIG. 7 is a diagram showing the bracket device in FIG. 6 being mounted to the post, and the bracket being fixed to the post through a fixing member.

As shown in FIG. 7, when the first rail 30 is further moved along the direction D, the pair of mounting members 40 of the bracket device 24 can be mounted to the first hole 80a and the second hole 80b of the first post 28a, and the elastic member 70 can release the elastic force to allow the locking member 42 to return to the locking position L1 from the unlocking position L2 in response to the elastic force of the elastic member 70 for locking the first post 28a. Meanwhile, the locking part 58 of the locking member 42 locks the first post 28a. Briefly, the bracket device 24 can be mounted to the first post 28a. Wherein, when the locking member 42 locks the first post 28a, the mounting hole 59 of the locking part 58 of the locking member 42 is located at a position corresponding to the third hole 80c of the first post 28a. Preferably, the bracket device 24 further comprises a fixing member 84 configured to fix the end plate 46 of the bracket 38 to the first post 28a through the mounting hole 59.

As shown in FIG. 8 and FIG. 9, the first post 28a has a first thickness W1. On the other hand, the locking member 42 of the bracket device 24 can be located at a first position P1 relative to the bracket 38 through the moving area 67. When the locking member 42 is located at the first position P1 relative to the bracket 38, a first distance X1 is defined between the locking part 58 of the locking member 42 and the end plate 46 of the bracket 38. As shown in FIG. 10, the pair of mounting members 40 of the bracket device 24 can be mounted to the first hole 80a and the second hole 80b of the first post 28a along the direction D, and the locking member 42 further locks the first post 28a in response to the elastic force of the elastic member 70. Wherein, the first distance X1 between the locking part 58 of the locking member 42 and the end plate 46 of the bracket 38 corresponds to the first thickness W1 of the first post 28a. In particular, the first distance X1 is greater than or equal to the first thickness W1 of the first post 28a, in order to allow the locking part 58 of the locking member 42 to lock the first post 28a.

FIG. 11 is a diagram showing the bracket device 24 applicable to another first post 200. In particular, the first post 200 has a second thickness W2 greater than the first thickness W1 of the first post 28a. On the other hand, as shown in FIG. 12, the locking member 42 of the bracket device 24 can be located at the first position P1 relative to the bracket 38 through the moving area 67. When the locking member 42 is located at the first position P1 relative to the bracket 38, a first distance X1 is defined between the locking part 58 of the locking member 42 and the end plate 46 of the bracket 38.

As shown in FIG. 13, when the first rail 30 of the slide rail assembly 20 is moved toward the first post 200 along the direction D with the bracket device 24, the locking member 42 is rotated to be in the unlocking state (such operation is well known to those skilled in the art, therefore, no further illustration is provided). On the other hand, the pair of mounting members 40 of the bracket device 24 are respectively aligned and extended to a first hole 202 and a second hole 204 of the first post 200.

As shown in FIG. 14 and FIG. 15, when the pair of mounting members 40 of the bracket device 24 are mounted to the first post 200, the locking member 42 returns to the locking state from the unlocking state. Wherein, since the first post 200 has the second thickness W2, the locking member 42 can be longitudinally moved relative to the bracket 38 from the first position P1 to a second position P2 through the moving area 67 during the process of the locking member 42 returning to the locking state. When the locking member 42 is located at the second position P2 relative to the bracket 38, a second distance X2 is defined between the locking part 58 of the locking member 42 and the end plate 46 of the bracket 38 (that is to say, a distance between the locking part 58 of the locking member 42 and the end plate 46 of the bracket 38 is changed from the first distance X1 to the second distance X2). The second distance X2 corresponds to the second thickness W2 of the first post 200. In particular, the second distance X2 is greater than or equal to the second thickness W2 of the first post 200 in order to allow the locking part 58 of the locking member 42 to lock the first post 200.

Therefore, the locking member 42 can be longitudinally moved relative to the bracket 38 between the first position P1 and the second position P2 through the moving area 67, such that the bracket device 24 can be mounted to posts with different thicknesses.

Figure 18:
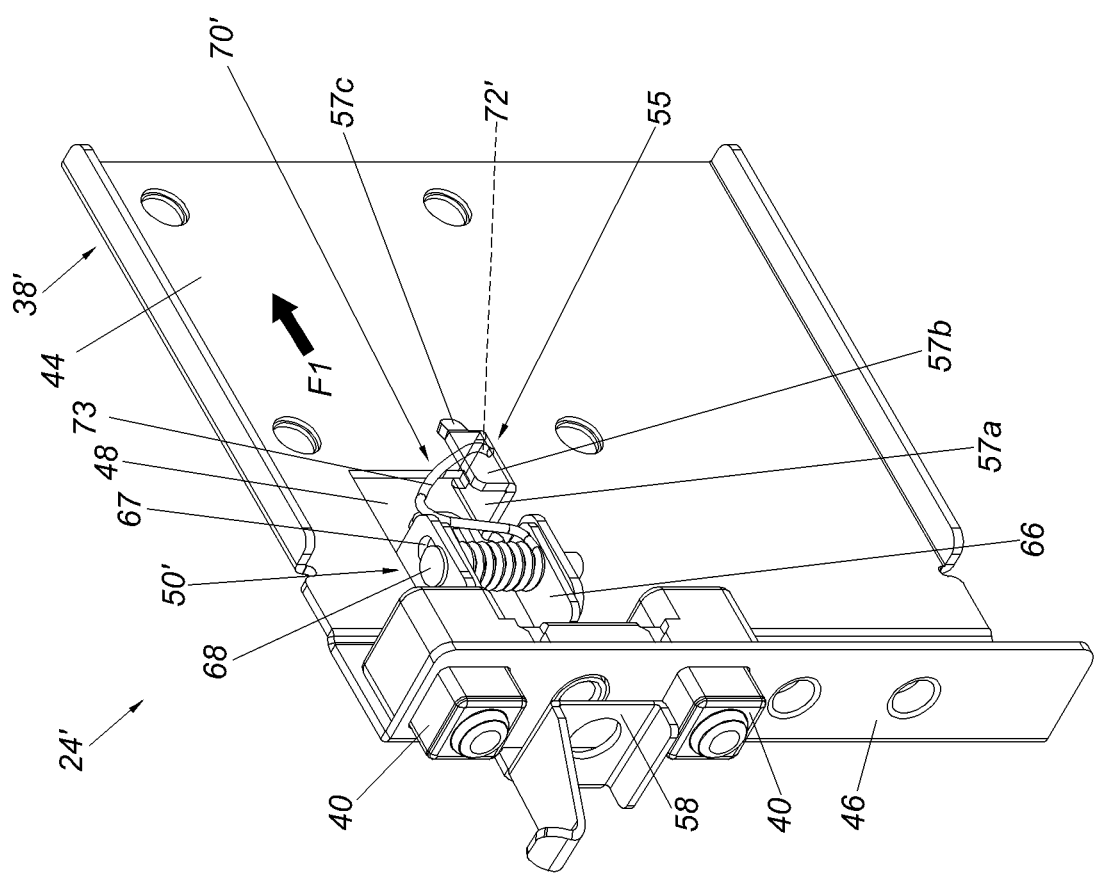
FIG. 18 is a diagram showing the bracket device according to the second embodiment of the present invention.

As shown in FIG. 16, FIG. 17 and FIG. 18, a first bracket device 24' (hereinafter referred to as bracket device 24') of a second embodiment of the present invention comprises a bracket 38', at least one mounting member 40 and a locking member 42.

The bracket 38' has a side plate 44 and an end plate 46 connected to the side plate 44. Wherein, the end plate 46 is substantially perpendicularly connected to the side plate 44. Preferably, the side plate 44 of the bracket 38' has an opening 48, and the bracket 38' has at least one ear part 50' connected to the side plate 44. In the present embodiment, the bracket 38' has a pair of ear parts 50' connected to the slide plate 44 and adjacent to the opening 48 for example. Different from the bracket 38 of the first embodiment, the bracket 38' further comprises an extension section 55 arranged adjacent to one of the ear parts 50'. The extension section 55 comprises a first wall 57a, a second wall 57b and an extension protrusion 57c. Wherein, the second wall 57b is substantially perpendicularly extended from the first wall 57a, and the extension protrusion 57c is extended from a portion of an end of the second wall 57b and away from the pair of ear parts 50'.

In the second embodiment of the present invention, the at least one mounting member 40 and the locking member 42 are identical or similar to the at least one mounting member 40 and the locking member in the first embodiment. For simplification, no further illustration is provided.

Preferably, the bracket device 24' further comprises a pivoting member 68 and an elastic member 70'. The pivoting member 68 penetrates through a portion of the moving area 67. In particular, the pivoting member 68 penetrates through a portion of the moving area 67 of the bracket 38' and the pair of protrusion sections 66 of the locking member 42. The elastic member 70' is configured to provide an elastic force to the locking member 42. The locking member 42 is located at a predetermined position in response to the elastic force of the elastic member 70'. Furthermore, the elastic member 70' comprises a first part 72', a second part 74' and a winding part 76' arranged between the first part 72' and the second part 74'. The winding part 76' provides a space 78 for allowing a portion of the pivoting member 68 to pass through. The first part 72' is configured to contact the bracket 38'. The second part 74' is configured to contact the locking member 42. In the present embodiment, the first part 72' abuts against the extension section 55 of the bracket 38', and the second part 74' abuts against the base part 56 of the locking member 42. Preferably, the first part 72' has a substantially U-shaped elastic arm 73 for generating a pulling force along a direction F1 to pull the locking member 42 relative to the end plate 46 of the bracket 38'. Or, in another embodiment (not shown in figures), an additional tension spring can be connected between the locking member 42 and the bracket 38' for generating a pulling force along the direction F1 to the locking member 42 relative to the end plate 46 of the bracket 38'.

Figure 19:
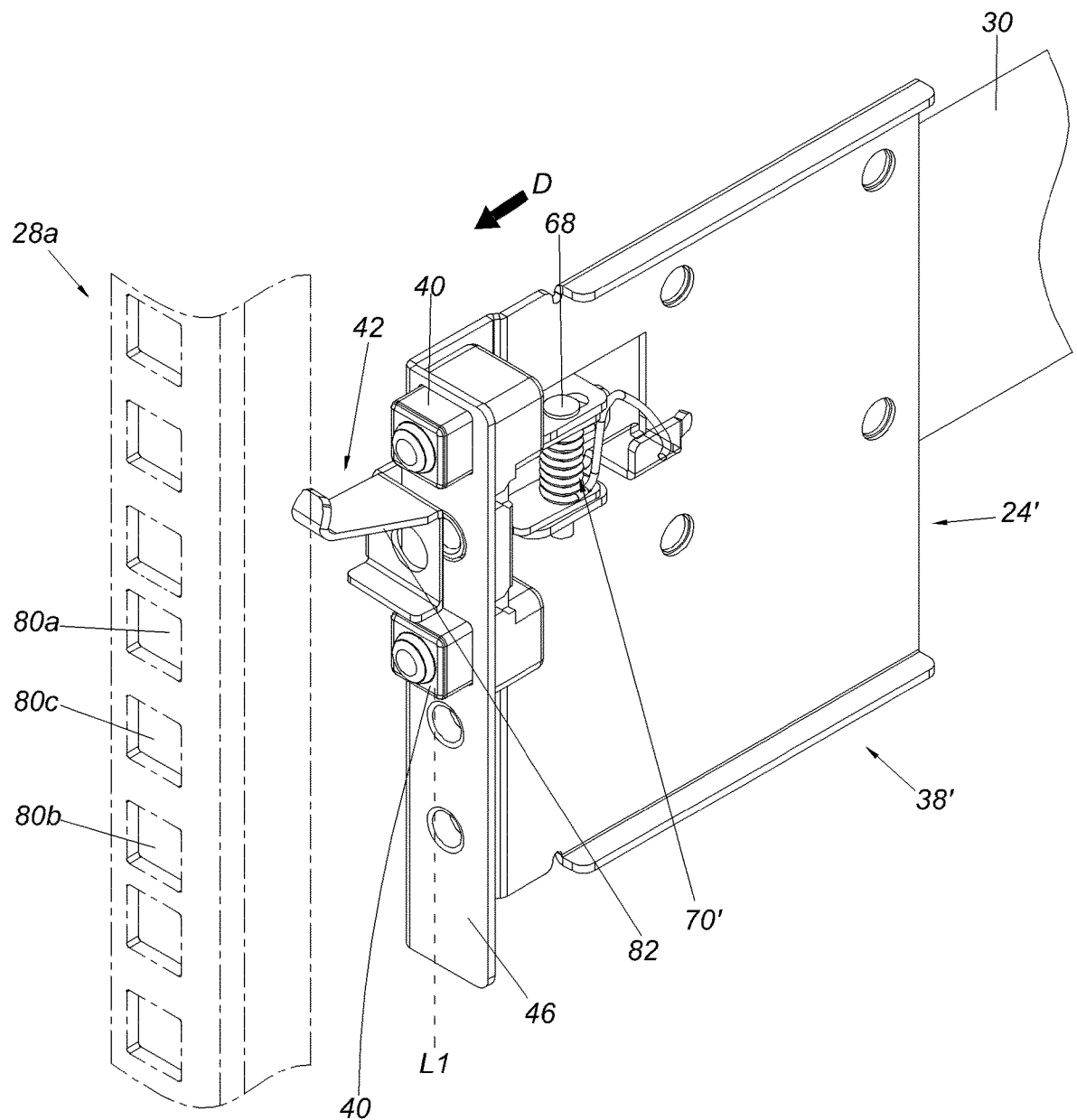
FIG. 19 is a diagram showing a slide rail being moved toward a post along a direction with the bracket device according to the second embodiment of the present invention.
Figure 20:
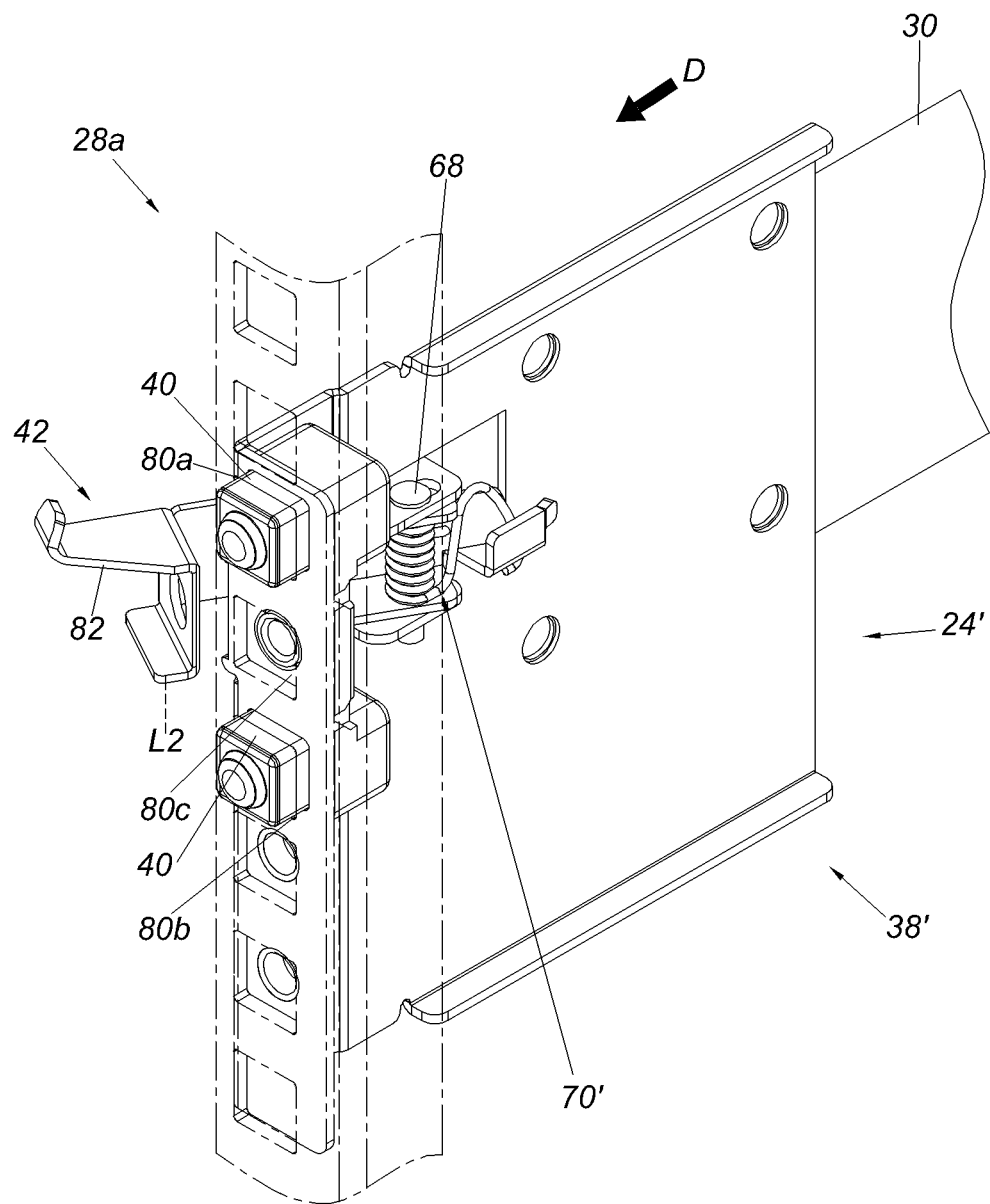
FIG. 20 is a diagram showing the locking member of the bracket device being in an unlocking state relative to the bracket, and mounting members on the bracket being aligned to holes of the post according to the second embodiment of the present invention.
Figure 21:
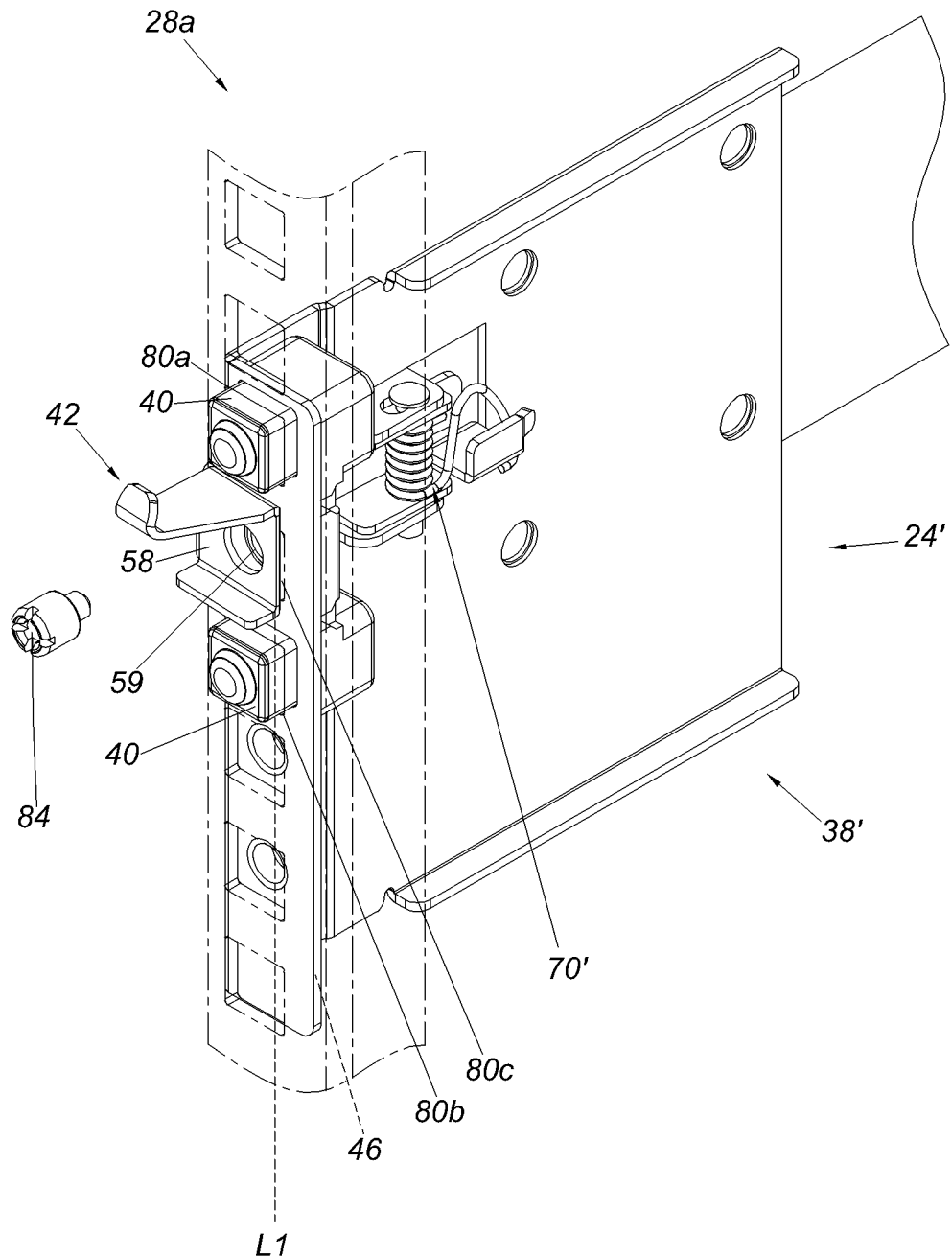
FIG. 21 is a diagram showing the bracket device of the second embodiment of the present invention being mounted to the post, and the bracket being fixed to the post through a fixing member.

FIG. 19, FIG. 20 and FIG. 21 are figures showing the bracket device of the second embodiment of the present invention being mounted and fixed to the post. Operations in FIG. 19, FIG. 20 and FIG. 21 are similar to operations in FIG. 5, FIG. 6 and FIG. 7, therefore, no further illustration is provided.

Figures 22, 23:
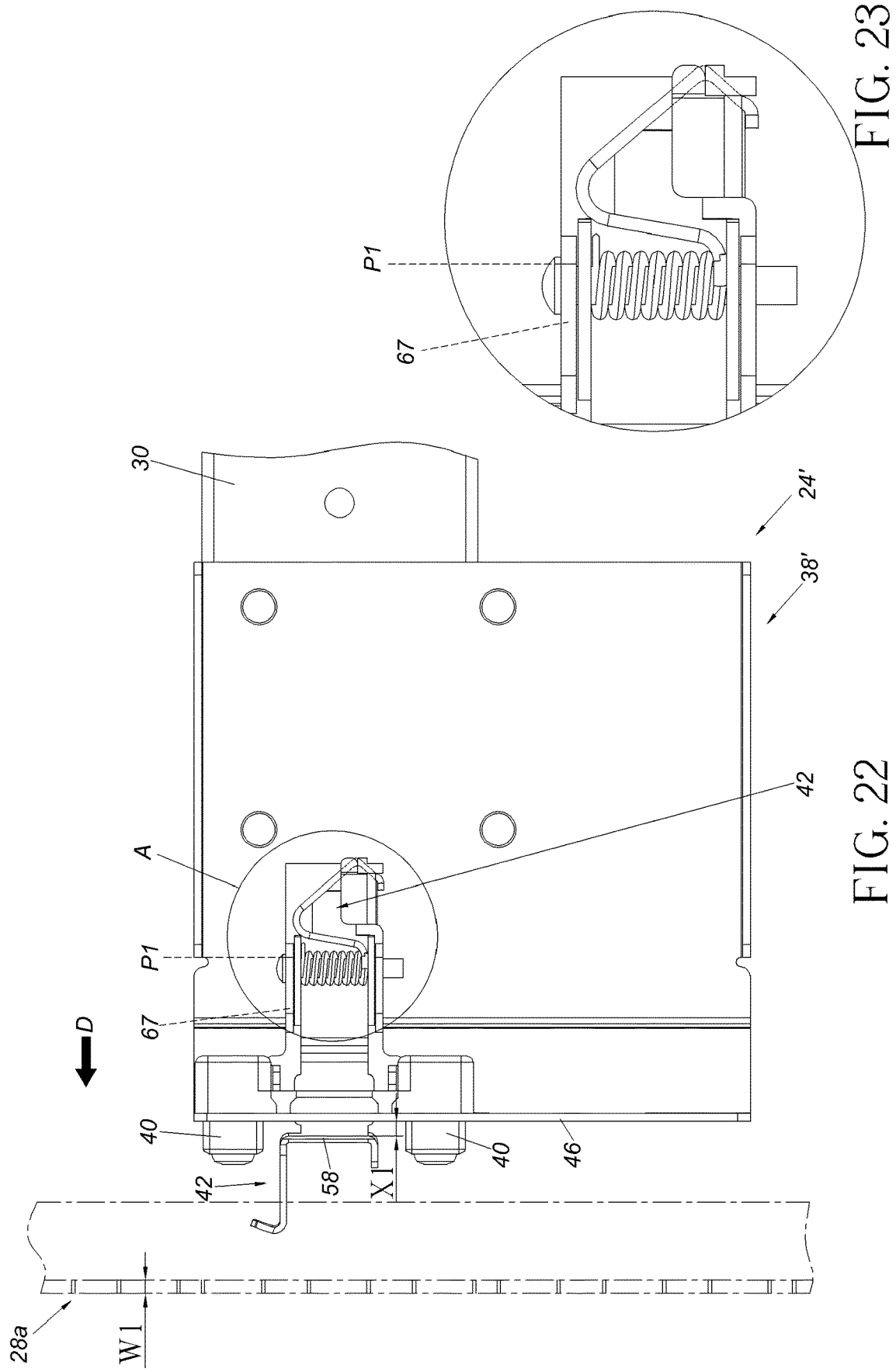
FIG. 22 is a diagram showing the bracket device of the second embodiment of the present invention being moved toward the post in order to mount a rail to a post with a first thickness.
FIG. 23 is an enlarged view of an area A in FIG. 22 for showing the locking member being located at the first position relative to the bracket.
Figure 24:
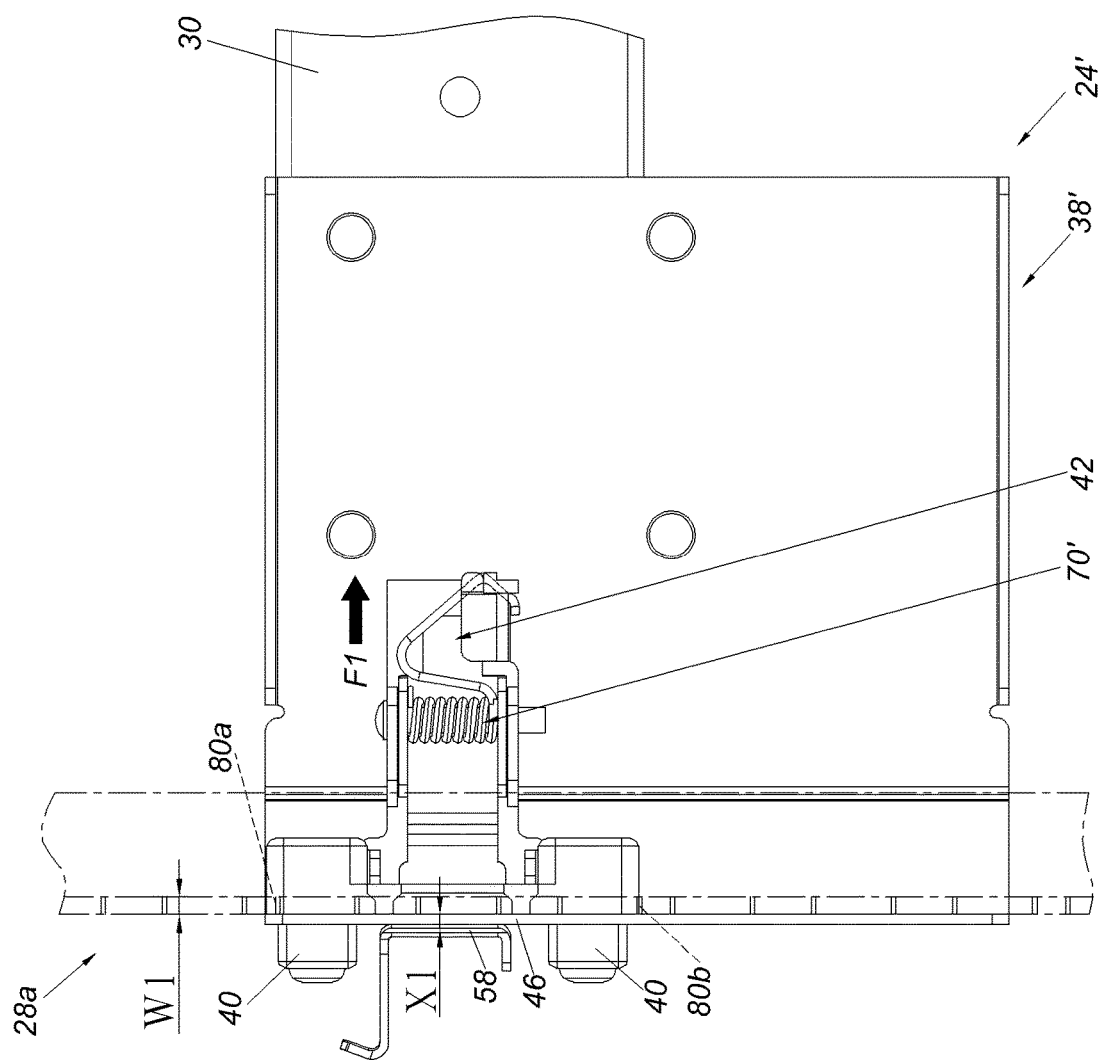
FIG. 24 is a diagram showing the bracket device of the second embodiment of the present invention being mounted to the post with the first thickness, and the locking member abutting against the post in response to a pulling force along a direction F1.

As shown in FIG. 22 and FIG. 23, the first post 28a has a first thickness W1. On the other hand, the locking member 42 of the bracket device 24' can be located at a first position P1 relative to the bracket 38' through the moving area 67. When the locking member 42 is located at the first position P1 relative to the bracket 38', a first distance X1 is defined between the locking part 58 of the locking member 42 and the end plate 46 of the bracket 38'. As shown in FIG. 24, the pair of mounting members 40 of the bracket device 24' can be mounted to the first hole 80a and the second hole 80b of the first post 28a, and the locking member 42 further locks the first post 28a in response to the elastic force of the elastic member 70'. Wherein, the first distance X1 between the locking part 58 of the locking member 42 and the end plate 46 of the bracket 38' corresponds to the first thickness W1 of the first post 28a. In particular, the first distance X1 is greater than or equal to the first thickness W1 of the first post 28a, in order to allow the locking part 58 of the locking member 42 to lock the first post 28a. In addition, the elastic arm 73 of the first part 72' of the elastic member 70' can provide the pulling force along the direction F1 to allow the locking member 42 to tightly contact with the first post 28a in response to the pulling force.

Figure 25:
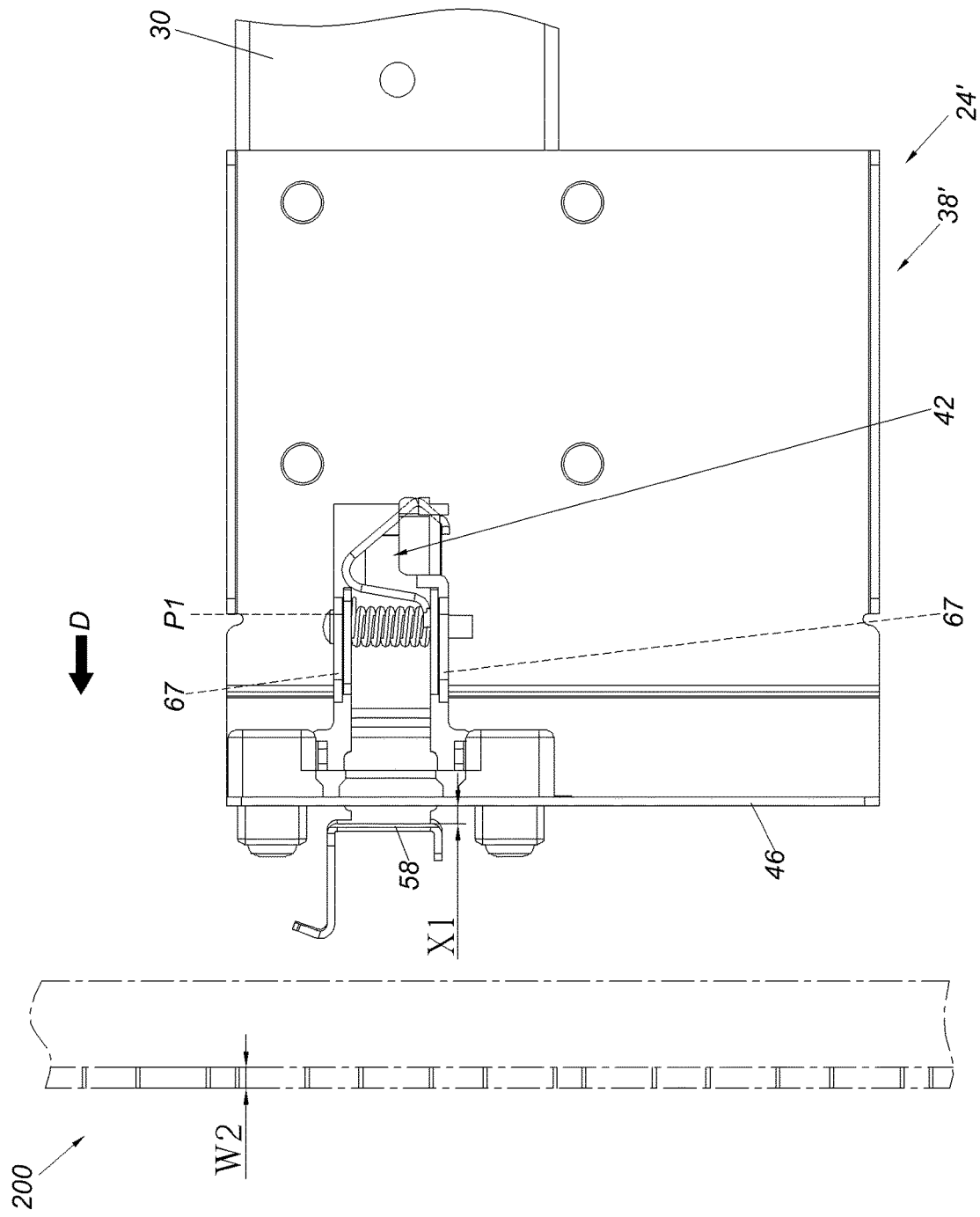
FIG. 25 is a diagram showing the bracket device of the second embodiment of the present invention being moved toward another post for mounting the rail to the another post with a second thickness.
Figure 26:
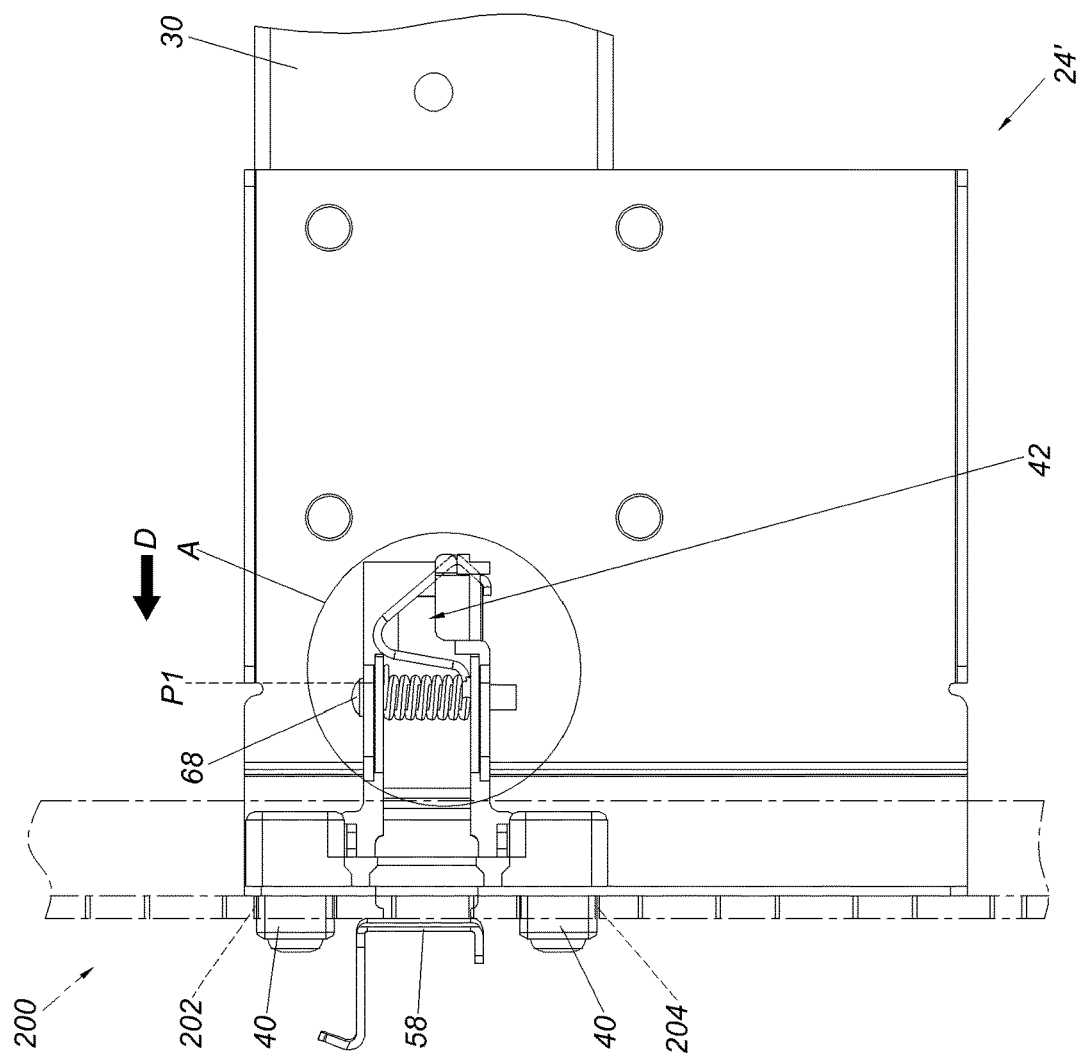
FIG. 26 is a diagram showing the mounting members on the bracket of the bracket device being aligned to holes of the post according to the second embodiment of the present invention.

FIG. 24 is a diagram showing the bracket device 24' applicable to another first post 200. In particular, the first post 200 has a second thickness W2 greater than the first thickness W1 of the first post 28a. On the other hand, as shown in FIG. 25 and FIG. 26, the locking member 42 of the bracket device 24' can be located at the first position P1 relative to the bracket 38' through the moving area 67. When the locking member 42 is located at the first position P1 relative to the bracket 38', a first distance X1 is defined between the locking part 58 of the locking member 42 and the end plate 46 of the bracket 38'.

Figure 27:
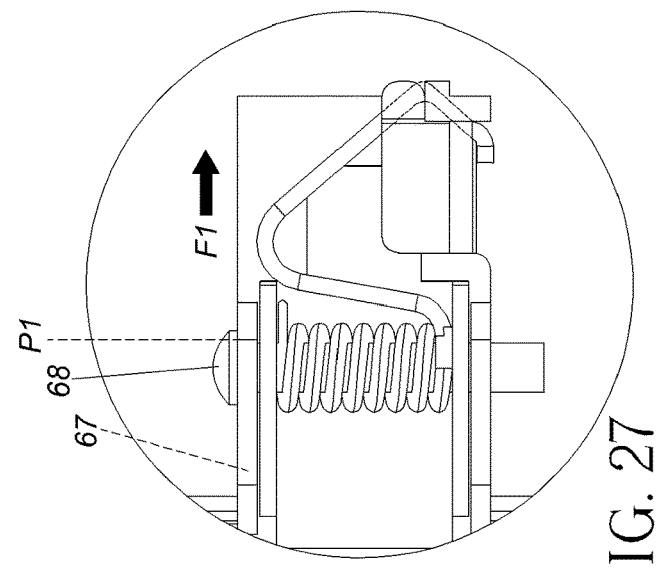
FIG. 27 is an enlarged view of an area A in FIG. 26 for showing the locking member being located at the first position relative to the bracket.

As shown in FIG. 27, when the first rail 30 of the slide rail assembly 20 is mounted to the first post 200 through the bracket device 24', the locking member 42 is rotated to be in the unlocking state (such operation is well known to those skilled in the art, therefore, no further illustration is provided). On the other hand, the pair of mounting members 40 of the bracket device 24' are respectively aligned and extended to the first hole 202 and the second hole 204 of the first post 200.

Figure 29:
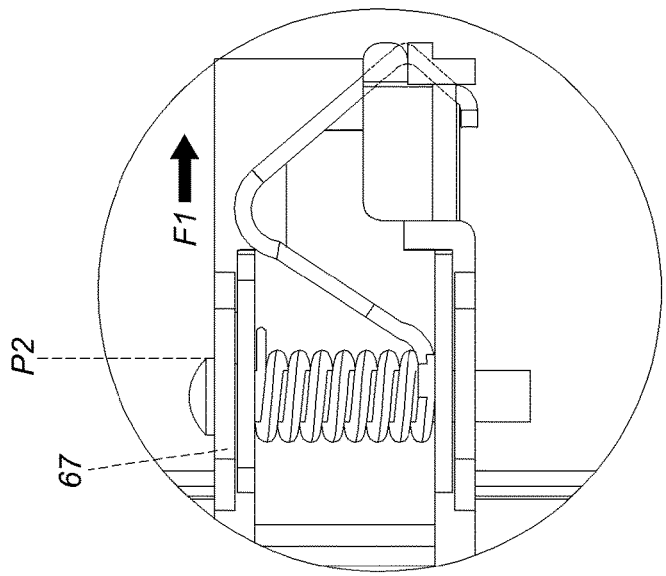
FIG. 29 is an enlarged view of an area A in FIG. 28 for illustrating the locking member being located at the second position relative to the bracket.
Figure 28:
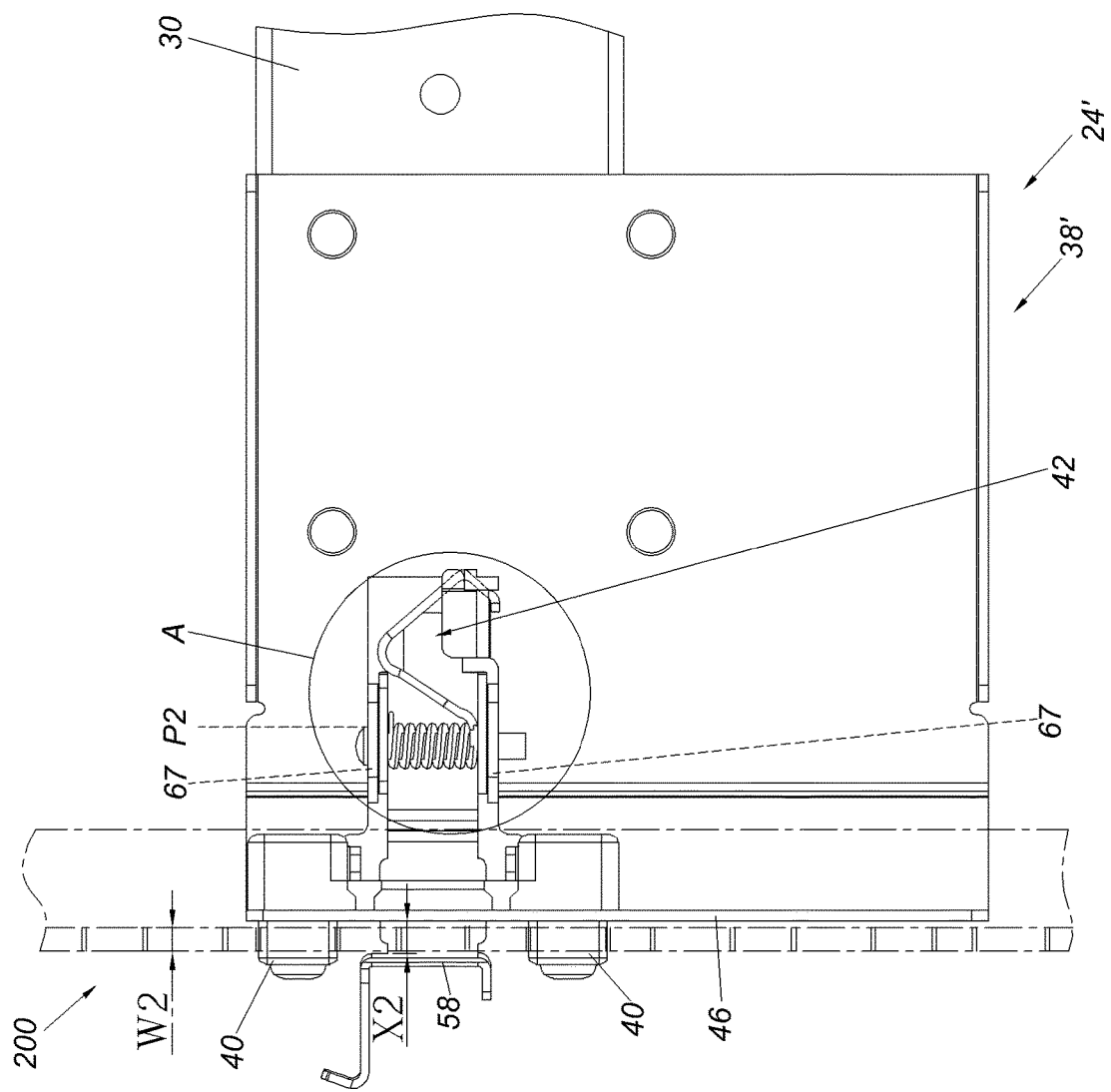
FIG. 28 is a diagram showing the bracket device of the second embodiment of the present invention being mounted to the post with the second thickness.
Figure 30:
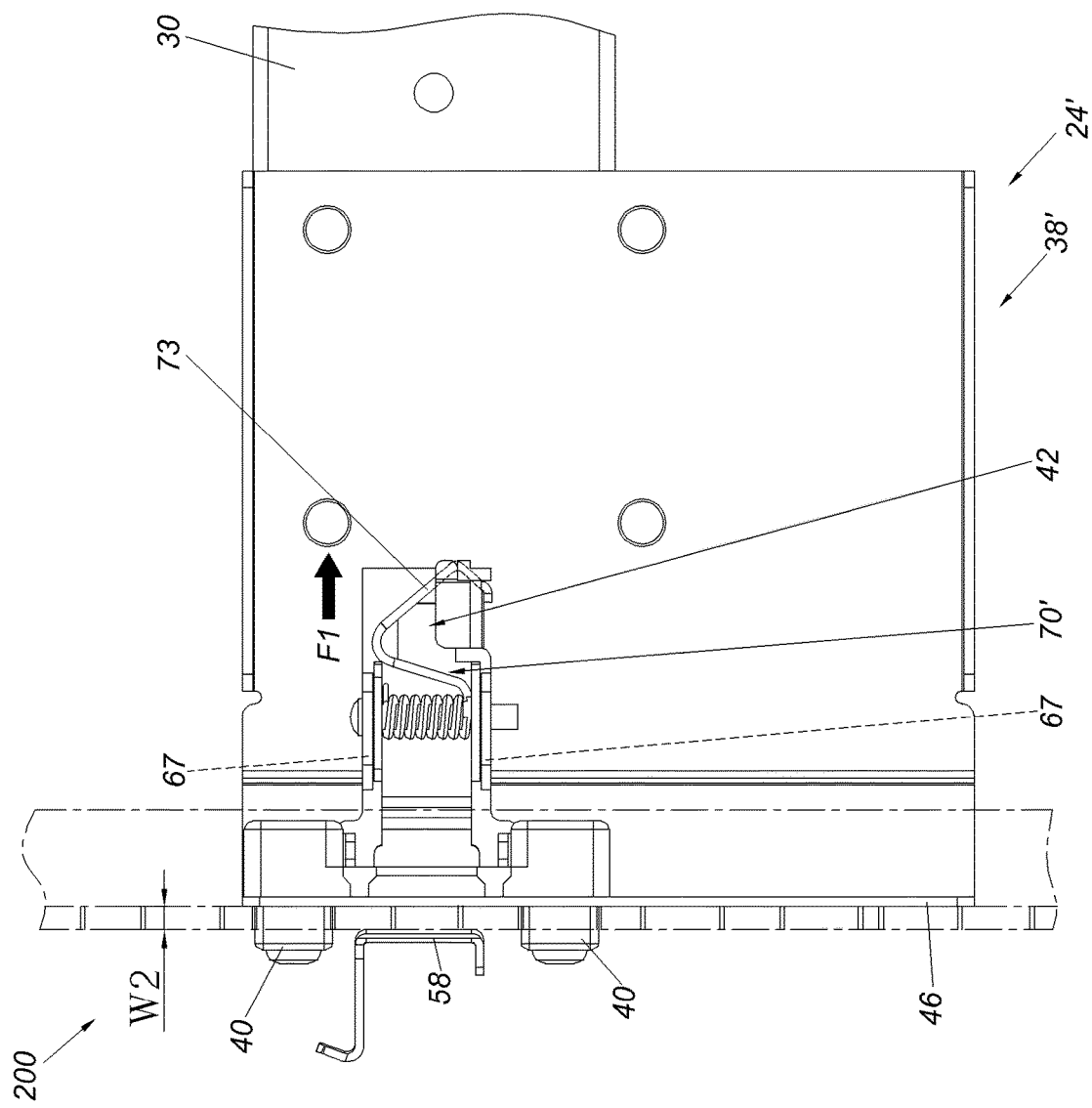
FIG. 30 is a diagram showing the bracket device of the second embodiment of the present invention being mounted to the post with the second thickness, and the locking member abutting against the post in response to the pulling force along the direction F1.

As shown in FIG. 28 and FIG. 29, when the pair of mounting members 40 of the bracket device 24' are mounted to the first post 200, the locking member 42 returns to the locking state from the unlocking state. Wherein, since the first post 200 has the second thickness W2, the locking member 42 can be longitudinally moved relative to the bracket 38' from the first position P1 to the second position P2 through the moving area 67 during the process of the locking member 42 returning to the locking state. When the locking member 42 is located at the second position P2 relative to the bracket 38', a second distance X2 is defined between the locking part 58 of the locking member 42 and the end plate 46 of the bracket 38' (that is to say, a distance between the locking part 58 of the locking member 42 and the end plate 46 of the bracket 38' is changed from the first distance X1 to the second distance X2). The second distance X2 corresponds to the second thickness W2 of the first post 200. In particular, the second distance X2 is greater than or equal to the second thickness W2 of the first post 200 in order to allow the locking part 58 of the locking member 42 to lock the first post 200. In addition, as shown in FIG. 30, the elastic arm 73 of the elastic member 70' can provide the pulling force along the direction F1 to allow the locking member 42 to tightly contact with the first post 200 in response to the pulling force.

Accordingly, the locking member 42 can be longitudinally moved relative to the bracket 38' between the first position P1 and the second position P2 through the moving area 67, and the elastic arm of the elastic member can provide the pulling force to allow the locking member to tightly contact with a post of an object to be mounted in response to the pulling force. Therefore, the bracket device 24' can be stably and firmly mounted to posts with different thicknesses.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bracket device, comprising:
    a bracket having a side plate and an end plate connected to the side plate, the side plate extending along a longitudinal direction;
    a mounting member arranged on the end plate of the bracket;
    a locking member comprising a locking part and a guiding part longitudinally protruding from the locking part; and
    an elastic member configured to provide an elastic force to the locking member, so as to keep the locking member in a locking position in response to the elastic force;
    wherein, one of the bracket and the locking member provides a moving area, which is an elongated hole arranged in the longitudinal direction or an elongated slot arranged in the longitudinal direction, for allowing the locking member to move in the longitudinal direction between a first position and a second position relative to the bracket;
    wherein, the guiding part of the locking member is substantially perpendicular to the locking part and has an inclined surface along the longitudinal direction configured to guide the locking member to be moved to an unlocking position from the locking position;
    wherein, when the locking member is moved to the unlocking position, the elastic member accumulates the elastic force that returns the locking member to the locking position from the unlocking position.

2. The bracket device of claim 1, further comprising a pivoting member penetrating through a portion of the moving area, wherein the locking member is rotatable relative to the bracket through the pivoting member.

3. The bracket device of claim 1, wherein the end plate is substantially perpendicularly connected to the side plate, a first distance is defined between the locking part of the locking member and the end plate of the bracket when the locking member is located at the first position relative to the bracket; a second distance is defined between the locking part of the locking member and the end plate of the bracket when the locking member is located at the second position relative to the bracket.

4. The bracket device of claim 3, wherein the bracket has at least one ear part connected to the side plate, the at least one ear part provides the moving area, the locking member further comprises a base part, a protrusion section is formed on the base part and bent relative to the base part, the pivoting member penetrates through the protrusion section of the locking member and the moving area of the at least one ear part.

5. The bracket device of claim 4, wherein the side plate of the bracket has an opening arranged at a position corresponding to the base part of the locking member.

6. The bracket device of claim 1, wherein the elastic member comprises a first part, a second part and a winding part arranged between the first part and the second part, the winding part is configured to allow a portion of the pivoting member to pass through, the first part is configured to contact the bracket, the second part is configured to contact the locking member.

7. The bracket device of claim 3, wherein the locking part of the locking member has a mounting hole, the bracket device further comprises a fixing member detachable from the locking part and configured to be fixed to the end plate of the bracket through the mounting hole.

8. The bracket device of claim 1, wherein the elastic member comprises a first part, a second part and a winding part arranged between the first part and the second part, the winding part provides a space for allowing a portion of the pivoting member to pass through; the bracket has an extension section, the first part of the elastic member is configured to abut against the extension section of the bracket, the second part of the elastic member is configured to abut against the locking member.

9. The bracket device of claim 8, wherein the first part of the elastic member has a substantially U-shaped elastic arm for generating a pulling force to pull the locking member toward the first position relative to the end plate of the bracket.

10. A bracket device, comprising:
a bracket having a side plate and an end plate;
a mounting member arranged on the end plate of the bracket;
a locking member comprising a locking part and a guiding part longitudinally protruding from the locking part, the locking part of the locking member being arranged outside of the side plate and the end plate of the bracket; and
an elastic member configured to provide an elastic force to the locking member, so as to keep the locking member in a locking position in response to the elastic force;
wherein, one of the bracket and the locking member provides a moving area for allowing the locking member to move between a first position and a second position relative to the bracket;
wherein, a first distance is defined between the locking part of the locking member and the end plate of the bracket when the locking member is located at the first position relative to the bracket;
wherein, a second distance is defined between the locking part of the locking member and the end plate of the bracket when the locking member is located at the second position relative to the bracket;
wherein, the guiding part of the locking member is substantially perpendicular to the locking part and has an inclined surface along the longitudinal direction configured to guide the locking member to be moved to an unlocking position from the locking position;
wherein, when the locking member is moved to the unlocking position, the elastic member accumulates the elastic force that returns the locking member to the locking position from the unlocking position.

11. The bracket device of claim 10, further comprising a pivoting member penetrating through a portion of the moving area, wherein the locking member is rotatable relative to the bracket through the pivoting member.

12. The bracket device of claim 11, wherein the elastic member comprises a first part, a second part and a winding part arranged between the first part and the second part, the winding part is configured to allow a portion of the pivoting member to pass through, the first part is configured to contact the bracket, the second part is configured to contact the locking member.

13. The bracket device of claim 12, wherein the bracket has an extension section, the first part of the elastic member is configured to abut against the extension section of the bracket, the first part of the elastic member has a substantially U-shaped elastic arm for generating a pulling force to pull the locking member toward the first position relative to the end plate of the bracket.

14. A bracket device configured to be mounted to a first post with a first thickness or another post with a second thickness, the first post and the another post both having a hole, the bracket device comprising:
a bracket having a side plate and an end plate substantially perpendicularly connected to the side plate;
a mounting member arranged on the end plate of the bracket and configured to penetrate through the hole of the post;
a locking member comprising a locking part and a guiding part longitudinally protruding from and substantially perpendicular to the locking part, the guiding part having an inclined surface along the longitudinal direction, the locking member being mounted to the bracket and being rotatable away from or toward the side plate such that the locking member is able to cross over an edge of the first post or an edge of the another post through being rotated away from the side plate, wherein one of the bracket and the locking member provides a moving area for allowing the locking member to move between a first position and a second position relative to the bracket, the locking member comprises a first distance is defined between the locking part and the end plate of the bracket when the locking member is located at the first position, a second distance is defined between the locking part and the end plate of the bracket when the locking member is located at the second position;
a pivoting member penetrating through a portion of the moving area, the locking member being rotatable relative to the bracket through the pivoting member; and
an elastic member configured to provide an elastic force to the locking member so as to keep the locking member in a locking position in response to the elastic force;
wherein, when the locking member is rotated away from the side plate and crosses over the edge of the first post to arrive at the first position, the locking member is moved via the inclined surface of the guiding part abutting against a lateral side of the first post so that the locking part is locked to the first post with the first thickness cooperatively with the end plate through being rotated toward the side plate;
wherein, when the locking member is rotated away from the side plate and crosses over the edge of the second post to arrive at the second position, the locking member is moved via the inclined surface of the guiding part abutting against a lateral side of the second post so that the locking part is locked to the another post with the second thickness cooperatively with the end plate through being rotated toward the side plate.

15. The bracket device of claim 14, wherein the bracket has at least one ear part connected to the side plate, the at least one ear part provides the moving area, the moving area is an elongated hole or an elongated groove, the locking member further comprises a base part, a protrusion section is formed on the base part and bent relative to the base part, the pivoting member penetrates through the protrusion section of the locking member and the moving area of the at least one ear part.

16. The bracket device of claim 14, wherein the elastic member comprises a first part, a second part and a winding part arranged between the first part and the second part, the winding part is configured to allow a portion of the pivoting member to pass through, the first part is configured to contact the bracket, the second part is configured to contact the locking member.

17. The bracket device of claim 16, wherein the bracket has an extension section, the first part of the elastic member is configured to abut against the extension section of the bracket, the first part of the elastic member has a substantially U-shaped elastic arm for generating a pulling force to pull the locking member toward the first position relative to the end plate of the bracket.

18. The bracket device of claim 14, wherein the locking part of the locking member has a mounting hole, the bracket device further comprises a fixing member detachable from the locking part and selectively configured to fix the end plate of the bracket to the post through the mounting hole.

* * * * *